(12) United States Patent
Montull et al.

(10) Patent No.: US 6,445,206 B1
(45) Date of Patent: Sep. 3, 2002

(54) METHOD AND APPARATUS FOR DETERMINING YIELD IMPACTING TESTS AT WAFER LEVEL PACKAGE LEVEL FOR SEMICONDUCTOR DEVICES

(75) Inventors: Juan Ignacio Alonso Montull, Madrid (ES); Carlos Ortega, Aspen Heights (SG); Eliseo Ventura Sobrino Patino, Bethlehem, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 1 day.

(21) Appl. No.: 09/583,936

(22) Filed: May 31, 2000

(51) Int. Cl.⁷ .............................................. G01R 31/26
(52) U.S. Cl. ..................... 324/765; 324/760; 257/620; 714/718
(58) Field of Search .................. 324/755, 756, 324/765, 754, 760, 158.1, 73.1; 437/8, 14; 257/536, 620, 734; 438/942; 714/718

(56) References Cited

U.S. PATENT DOCUMENTS

| | | | |
|---|---|---|---|
| 5,030,905 A | * | 7/1991 | Figal |
| 5,593,903 A | * | 1/1997 | Beckenbaugh |
| 5,594,273 A | * | 1/1997 | Dasse |
| 5,707,881 A | * | 1/1998 | Lum |
| 6,258,609 B1 | * | 7/2001 | Farnworth |

* cited by examiner

Primary Examiner—Michael J. Sherry
Assistant Examiner—Trung Nguyen

(57) ABSTRACT

A method for processing semiconductor wafers includes forming a plurality of wafers each comprising a plurality of dies, performing a plurality of tests on the dies to determine good dies and failed dies, and packaging the good dies. The tests are performed on the good dies after packaging to determine good packaged dies and failed packaged dies. A determination is made as to which tests indicate both failed dies and failed packaged dies so that corrective action may be taken. A database is formed to include test data collected at wafer level on dies before they are packaged, and test data collected at package level after the good dies have been packaged. The database and the results of the test comparisons are made available via the Internet so that other facilities processing the same type devices can review and compare the information to their own data. A global or worldwide monitoring of the test data is thus made available.

22 Claims, 35 Drawing Sheets

FIG. 3

| = | ORLANDO1 |
|---|---| ms233b3_r53_wfr_core_220  Wafers: 223  Devices: 326037

| 42 | 44 | 46 |
|---|---|---|
| -%FAIL | TEST NUM. | FAIL LOTS |
| 1.79 | 22100 | 223 |
| 1.74 | 10000 | 223 |
| 1.68 | 22000 | 223 |
| 1.42 | 12001 | 223 |
| 1.01 | 12000 | 187 |
| 0.67 | 11004 | 217 |
| 0.56 | 24000 | 201 |

| = | ORLANDO2 |
|---|---|

| = | MADRID |
|---|---| ms233b3_r53_wfr_core_220  Wafers: 114  Devices: 157757

| 42 | 44 | 46 |
|---|---|---|
| -%FAIL | TEST NUM. | FAIL LOTS |
| 1.59 | 22100 | 104 |
| 1.48 | 12000 | 54 |
| 1.43 | 22000 | 104 |
| 1.35 | 24008 | 87 |
| 1.30 | 91092 | 2 |
| 1.28 | 60004 | 107 |
| 1.06 | 10000 | 103 |
| 0.89 | 11004 | 106 |
| 0.38 | 24040 | 51 |
| 0.32 | 21010 | 9 |

| = | ALLENTOWN |
|---|---|

| = | SMP |
|---|---|

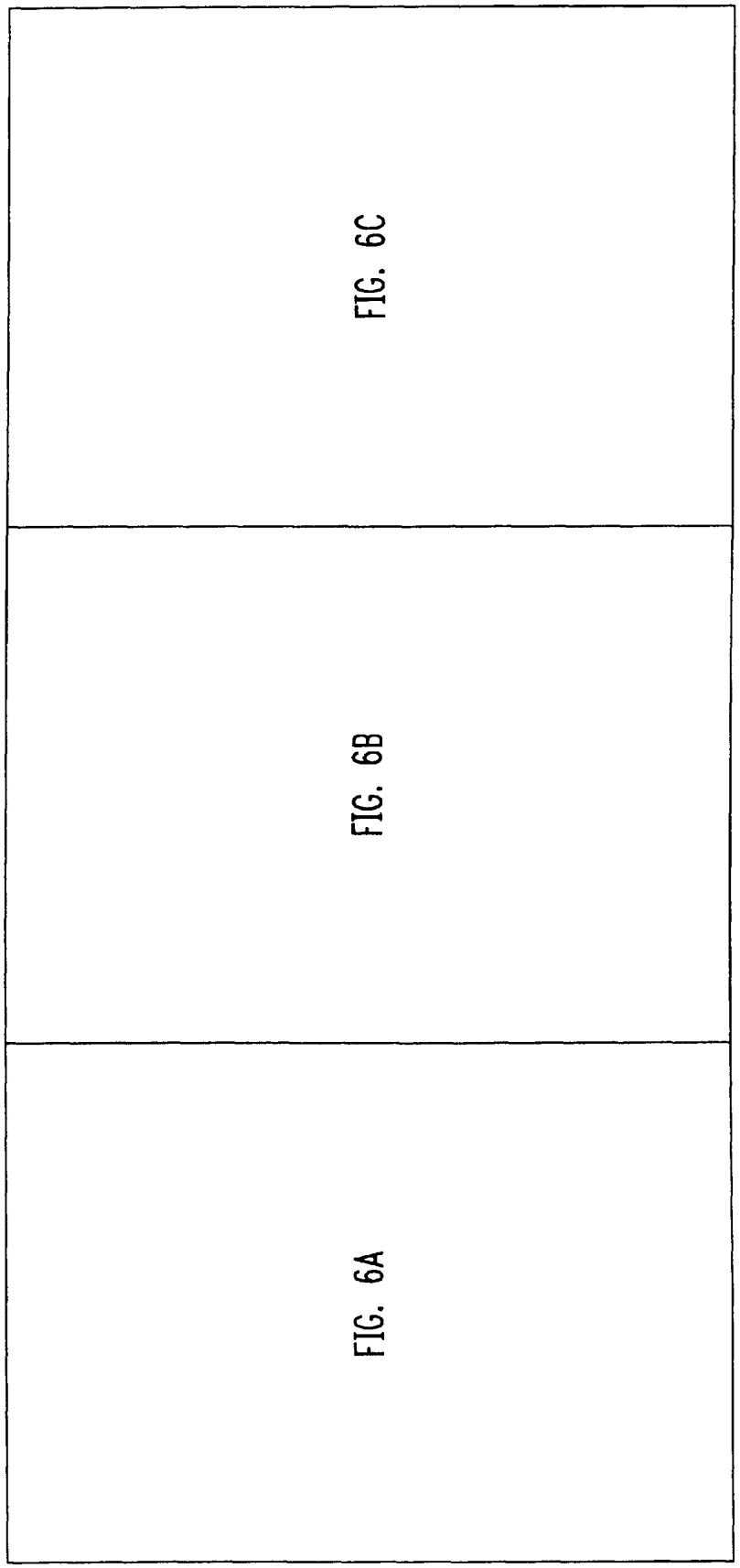

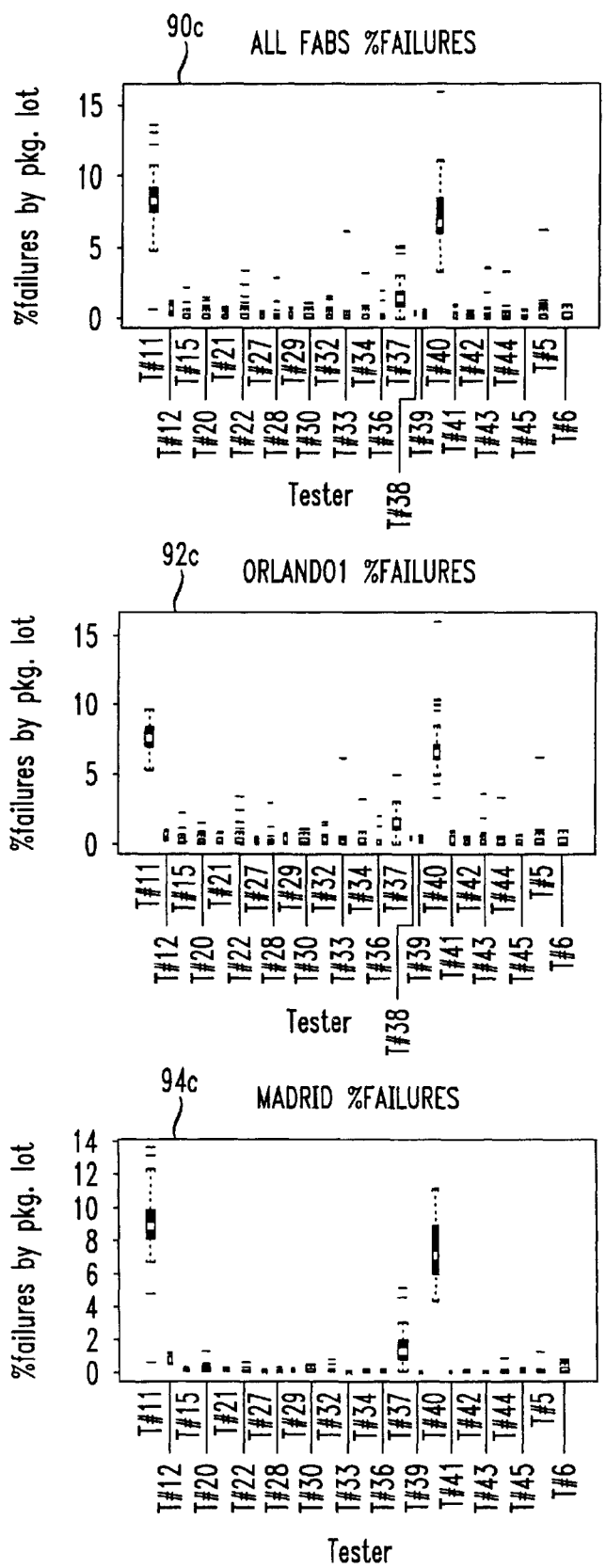

METHOD AND APPARATUS FOR DETERMINING YIELD IMPACTING TESTS AT WAFER LEVEL PACKAGE LEVEL FOR SEMICONDUCTOR DEVICES

FIELD OF THE INVENTION

The present invention relates to the field of semiconductor processing, and, more particularly, to a method and apparatus for increasing the yield of semiconductor wafers.

BACKGROUND OF THE INVENTION

Semiconductor wafer processing typically involves a sequence of process steps to form dies on the surface of a silicon wafer. At the completion of the process steps, a plurality of tests are performed on each die to determine good dies and failed dies. Up to several hundred individual tests may be performed on each die. Because of semiconductor wafer processing variations and undetected defects, the wafer may have passed all the in-process checks yet still have many dies that do not function.

After the dies have been tested, they are separated from the wafer by sawing or scribe-and-break techniques. The good dies identified at wafer sort are typically put in a protective or encapsulated package. After the good dies have been packaged, the plurality of tests are performed on the good dies after packaging to determine good packaged dies and failed packaged dies. These tests are typically performed at an increased temperature, which results in some of the good dies becoming failed packaged dies. Even though the wafer yield at package level is very high, there is still a need to improve the yield.

This problem is often compounded when the dies includes analog circuits because the collected test data will vary over a range. In contrast, collected test data for digital circuits are either a logic level 0 or a logic level 1. There is no variance. If collected test data for the analog circuits is on the edge of its desired range, i.e., a large variance, this is an indication that the same test performed at package level may likely cause the data to drift outside the desired range, thus causing the packaged die to fail.

There are typically three different groups involved in wafer yield analysis. A first group is the wafer level group located where the wafers are formed, a second group in the package level group located where the dies are packaged, and a third group is the product engineering core group which may not be collocated with the wafer level and package level groups. Each of these groups uses a different approach in their analysis for increasing wafer yield.

The wafer level group use software bin categories, good chips per wafer (GCW) and good to functional (GTF) numbers to control the yield. A first alarm is generated when GCW decreases. A subsequent step is to look at the GTF, and then to the bin categories. Once the impacting category is detected, the procedure transitions from looking for patterns in the wafer maps to correlation analysis with electrical test data or the process steps.

There are at least two negative implications using these numbers. The programs have at least 300 tests, and the number of software bin categories is very limited. Typically, there are about 25 bins. Consequently, one bin category represents several different tests. Sometimes two different problems are impacting in the same bin, which implies too much noise on the analysis.

A second problem is related to the use of the number of chips per wafer. A minimum group of failing wafer lots is needed to run correlation analysis, which means an extra waiting time. Another factor in the wafer fab environment is cycle time. Wafers are tested and immediately sent to the packaging factory. Recovery of failing dies is almost impossible.

The wafer level group is also interested in the package results of their devices. Test data at the package level is very different, even in the binning. Instead of software bins, the package level group uses hardware bins, which do not match with the software bins. This mismatch in storing the collected data reduces the analysis capability.

The package level group use a different approach to wafer yield analysis. The working material is the packaged devices themselves. Failed packaged devices can be stored and re-tested, for example, after a test program issue has been solved. Moreover, the testing environment is more flexible. Package level test databases are loaded with hardware bin data. These bins represent four different categories: good devices, functional, parametric and contact failures.

These categories define about 8 bins at the package level as compared to the 25 bins at the wafer level. Consequently, the 300 tests performed at the wafer level are now divided into a more limited number of bins. At least one of the 300 tests is generally responsible for a failed packaged die since the impact of a packaging process error on yield is rare. A packaging process error typically shows up as a contact or functional failure, which is relatively straightforward to identify.

The wafer level and package level groups have to deal with many different devices and technologies. Due to this fact, they cannot know each product in detail. Their analysis tools tend to be generic, and applicable to all products.

The product engineering core group includes engineers with a detailed knowledge of the devices. Studies done by this group explore the particularities of each device. Consequently, each test is analyzed separately. The product engineering core group uses a system of prioritization, which identifies the most yield impacting tests so that their efforts can be focused on the tests at the top of the list. Special data analysis tools are used as well as special routines developed by the product engineering core group.

Notwithstanding the above described efforts of the wafer level group, the package level group, and the product engineering core group, there is still a need to improve wafer yield after good dies have been packaged.

SUMMARY OF THE INVENTION

In view of the foregoing background, it is therefore an object of the present invention to efficiently determine yield impacting tests at wafer level and package level for increasing wafer yield.

It is yet another object of the present invention to define a database of the yield impacting tests so that the information may be accessed by other semiconductor manufacturing facilities for world-wide monitoring.

These and other objects, features and advantages in accordance with the present invention are provided by a method for processing semiconductor wafers, which includes forming a plurality of wafers each comprising a plurality of dies, performing a plurality of tests on the plurality of dies to determine good dies and failed dies, and packaging the good dies. The plurality of tests are preferably performed on the good dies after packaging to determine good packaged dies and failed packaged dies. A determination is preferably made as to which tests indicate both failed dies and failed packaged dies so that corrective action may be implemented. The method according to the present invention thus determines the yield impacting tests at wafer level and package level for increasing wafer yield.

Each die preferably includes analog circuits. Each performing of the plurality of tests preferably comprises applying analog input signals to each die, and measuring analog output signals therefrom. The method according to the present invention is particularly advantageous to dies including analog circuits since the test data values vary over a broader range, as compared to digital circuits having only a pass/fail criteria. Consequently, the test data can be analyzed so that a more thorough analysis may be provided.

The method preferably further includes prioritizing the plurality of tests performed on the dies based upon the failed dies, and prioritizing the plurality of tests performed on the packaged good dies based upon the failed packaged dies. The method preferably further includes defining a database based upon the prioritized tests performed on the dies and based upon the prioritized tests performed on the good dies after packaging. The database preferably comprises data collected at different manufacturing facilities. The database may be preferably accessed via the Internet so that so that other facilities processing the same type devices can review and compare the information to their own data. In other words, a global or worldwide monitoring of the test data is made available. It is thus possible to determine if a possible change on the test limits for a particular semiconductor wafer processing facility will effect the performance of the same test in another facility.

The method preferably further comprises calculating statistical data based upon the plurality of tests performed on the dies, and calculating statistical data based upon the plurality of tests performed on the good dies after packaging. The method preferably further comprises graphically displaying the statistical data for the tests. The statistical data preferably comprises mean and standard deviations for the tests.

Another aspect of the present invention is an apparatus comprising a first tester for performing a plurality of tests on a plurality of wafers each comprising a plurality of dies to determine good dies and failed dies, and a second tester for performing the plurality of tests on the good dies after packaging to determine good packaged dies and failed packaged dies. A processor is preferably connected to the first tester and to the second tester for determining which tests indicate both failed dies and failed packaged dies so that corrective action may be taken.

Each die preferably comprises analog circuits. The first and second testers each preferably perform the plurality of tests by applying analog input signals to each die, and measuring analog output signals therefrom. The processor preferably prioritizes the plurality of tests performed on the dies based upon the failed dies, and prioritizes the plurality of tests performed on the packaged good dies based upon the failed packaged dies.

A memory is preferably connected to the processor. The memory preferably stores a database based upon the prioritized tests performed on the dies and based upon the prioritized tests performed on the good dies after packaging. The database is preferably accessible via the Internet so that so that other facilities processing the same type devices can review and compare the information to their own data.

The processor preferably calculates statistical data based upon the plurality of tests performed on the dies, and calculates statistical data based upon the plurality of tests performed on the good dies after packaging. The apparatus preferably further includes a display connected to the processor for graphically displaying the statistical data for the tests.

DETAILED DESCRIPTION OF THE DRAWINGS

FIG. 3 is a prioritized list of wafer level tests at two different manufacturing facilities in accordance with the present invention.

FIGS. 4, 4A, 4B, and 4C is a group of plots illustrating wafer level versus package level results in accordance with the present invention.

FIGS. 5, 5A, 5B, and 5C is a group of plots illustrating statistical correlations of the test data at wafer level and at package level in accordance with the present invention.

FIGS. 6, 6A, 6B, and 6C is a group of plots illustrating histograms of wafer results in accordance with the present invention.

FIGS. 7, 7A, 7B, 7C, 7D, 7E, and 7F is a group of plots illustrating an evolution in time of the wafer results in accordance with the present invention.

FIGS. 8, 8A, 8B, and 8C is a group of plots illustrating package level results by tester in accordance with the present invention.

FIGS. 9, 9A, 9B, and 9C is a group of plots illustrating wafer results by wafer lot in accordance with the present invention.

FIGS. 10, 10A, 10B, and 10C is a group of plots illustrating wafer results by test program revision in accordance with the present invention.

Figure 11:
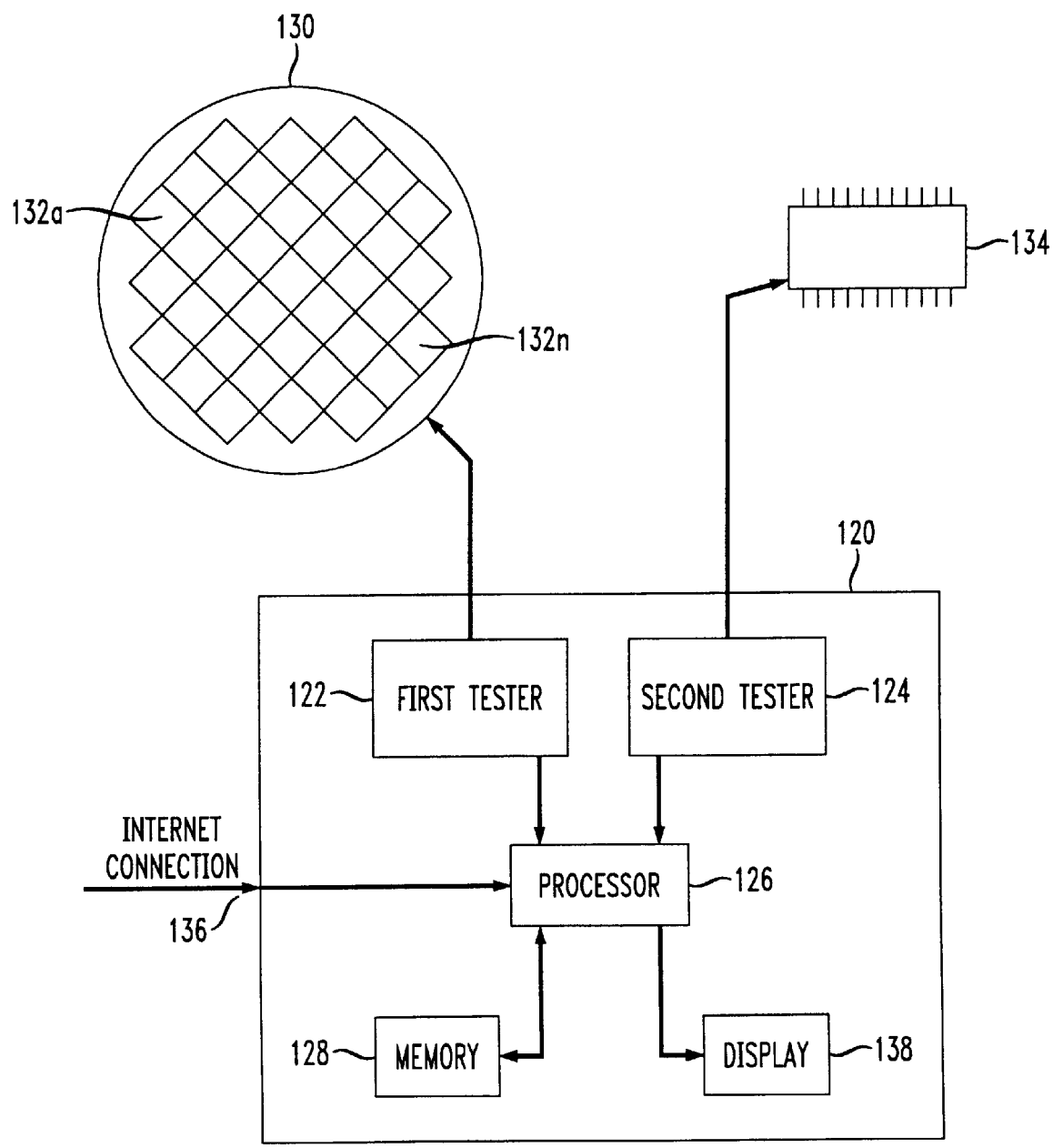

FIG. 11 is an apparatus implementing the method in accordance with the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A method for processing semiconductor wafers in accordance with the present invention will be described with reference to FIGS. 1–10. In particular, a database is formed to include test data collected at wafer level on dies before they are packaged, and test data collected at package level after good dies have been packaged. The database may include mean and standard deviations of the test data, and the percentage of failures for each test. A list of the tests in their order of importance (e.g., tests with the highest number failures) are identified at the wafer level and at the package level.

As will be explained in greater detail, a prioritized list of tests at the wafer level is compared with a prioritized list of tests at the package level to determine which tests are in common. In other words, a determination is made as to which tests indicate both failed dies and failed packaged dies. Corrective action may then be implemented based upon this comparison.

An advantageous feature of the present invention is that the prioritized list of tests performed at wafer level and at package level are used to define a database. The database and the results of the test comparisons are made available via the Internet so that other facilities processing the same type devices can review and compare the information to their own data. In other words, a global or worldwide monitoring of the test data is made available. It is thus possible to determine if a possible change on the test limits for a particular semiconductor wafer processing facility will effect the performance of the same test in another facility.

From the start (Block 10) of the semiconductor manufacturing process, process steps are performed for forming a plurality of wafers at Block 12. Each wafer comprises a plurality of dies, wherein each die may include digital and/or analog circuits. Process machines performing the process steps may be divided into four basic process operations: layering, patterning, doping and heating.

Each of these process operations requires several steps, which in turn involve a number of substeps. Overall, there may be about 200 to 300 process steps being performed for each wafer. The sequence of the four process operations for forming semiconductor wafers thus includes multiple combinations of the four process operations, as will be readily understood by one skilled in the art.

The process steps and the process machines themselves can introduce problems causing the wafer level yield to decrease. For example, the 200 to 300 different process steps being performed for each wafer are not always stable, and sometimes a shift in one process step results in a yield drop. A reduction in the wafer level yield can also be introduced by differences in the circuit performance test machines, and even by new test program revisions.

Actual methods for the detection of these problems are based on correlation analysis of yield and software bin categories with electrical tests and other in-line parameters. In addition, different machines may be used for forming the same type process steps for different wafer lots. Even machines of the same model can produce variations in the process, which can have an impact on the yield.

Typically, there may be about 20 to 50 lots of wafers being processed together. Each lot of wafers may include a large number of wafers, such as 25 wafers, for example. Depending on the size of the wafer and the type of device being formed, each wafer includes a large number of dies, such as 1,200 dies for a 6 inch wafer and 4,200 dies for an 8 inch wafer, for example.

After the wafers are formed, a plurality of circuit performance tests are performed on the plurality of dies at Block 12. Generally, every die of each wafer is measured to determine if the die is good or bad. The circuit performance tests are based upon a collection of circuit performance characteristic data. Circuit performance characteristic data includes test parameters such as output levels, offsets, frequency responses, etc.

When the dies include analog circuits, the circuit performance characteristic data is collected by applying analog input signals and measuring corresponding analog output signals. Ideally, measured circuit performance characteristics should be centered within a desired range. If so, the yield of the lot of wafers will be increased as well as the reliability of the semiconductor devices.

The plurality of circuit performance tests negatively effecting the wafer level yield are priortized at Block 16. Before a problem can be solved, the problem must first be identified. Yield is a good indicator, but very generic. Consequently, a list of failing tests is complied in order of importance, which generally includes listing the tests having the highest number of failures first. As an alternative or in addition to listing test failures, tests that have circuit performance characteristic data not centered within a desired interval (i.e., for analog circuits), but instead are at the limits, may also be listed. Even though the wafer level yield is not directly effected when the test data is within a limit, these tests may likely fail when repeated at package level testing.

The plurality of dies are divided into good dies and bad dies based upon the circuit performance data. The good dies are packaged at Block 18. Packaging or encapsulation of the dies includes encapsulating each die with a plastic material. Packaging is readily known by one skilled in the art and will not be discussed in further detail. A plurality of package performance tests are performed at Block 20 on the good dies after packaging to determine a good packaged dies and failed packaged dies.

Package level tests includes function, parametrics, shorts, opens, and good devices. The same 200 to 300 tests performed at the wafer level are also performed at the package level. Ideally, the package level yield should be 100%. However, since the packaged level tests are typically performed at a higher temperature than the circuit performance characteristic tests, additional failures occur.

The plurality of package performance tests that negatively effect the package level yield are prioritized at Block 22. As with the wafer level tests, a list of failing tests is complied in order of importance for the package level tests. The tests having the highest number of failures are generally listed first.

A database is defined at Block 24 based upon the prioritized tests performed on the dies before packaging, and based upon the prioritized tests performed on the good dies after packaging. This database may be accessible via the Internet so that so that other facilities processing the same type devices can review and compare the information to their own data. In other words, a global or worldwide monitoring of the test data is made available. For example, it is thus possible to determine if a possible change on the test limits for a particular semiconductor wafer processing facility will effect the performance of the same test in another facility. The database may include identification numbers, test program revision, tester and date for each wafer. In addition, mean and standard deviations of the test data, devices tested and percentage of failures for each test are also included in the database.

A determination is made at Block 26 to determine which tests indicate both failed dies and failed packaged dies. In other words, a common relationship in terms of a test or tests impacting the yield is identified. Corrective action may then be implemented at Block 28 based upon the determined common relationship. Correction action may include adjusting a semiconductor manufacturing process step, or changing specification limits if given customer approval.

Determination of the common relationship or root cause of the yield failures between wafer level and package level will now be described in greater detail. Plots for each of the tests included in the database based upon the priortized list of test failures are generated. The plots are distributed over a number of pages. The information is available in a postscript file that may identified by the code name and the test number: CODE_TESTNUM$_{13}$ plots.ps, for example. Although the prioritized lists may be generated on a weekly basis, the analysis may be performed over several weeks of test data, for example.

Figure 1:
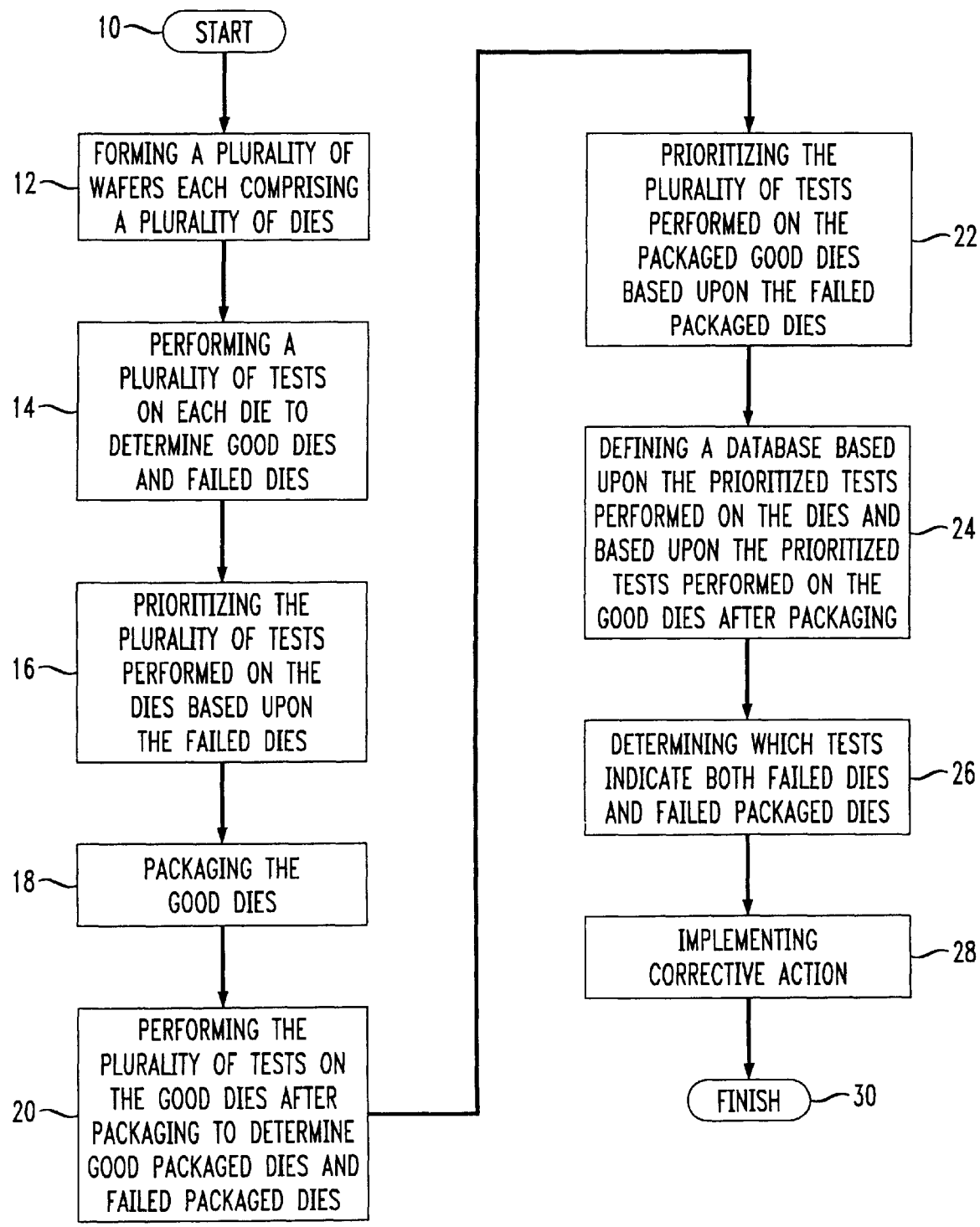
FIG. 1 is a flowchart illustrating a method for processing semiconductor wafers in accordance with the present invention.
Figure 2:
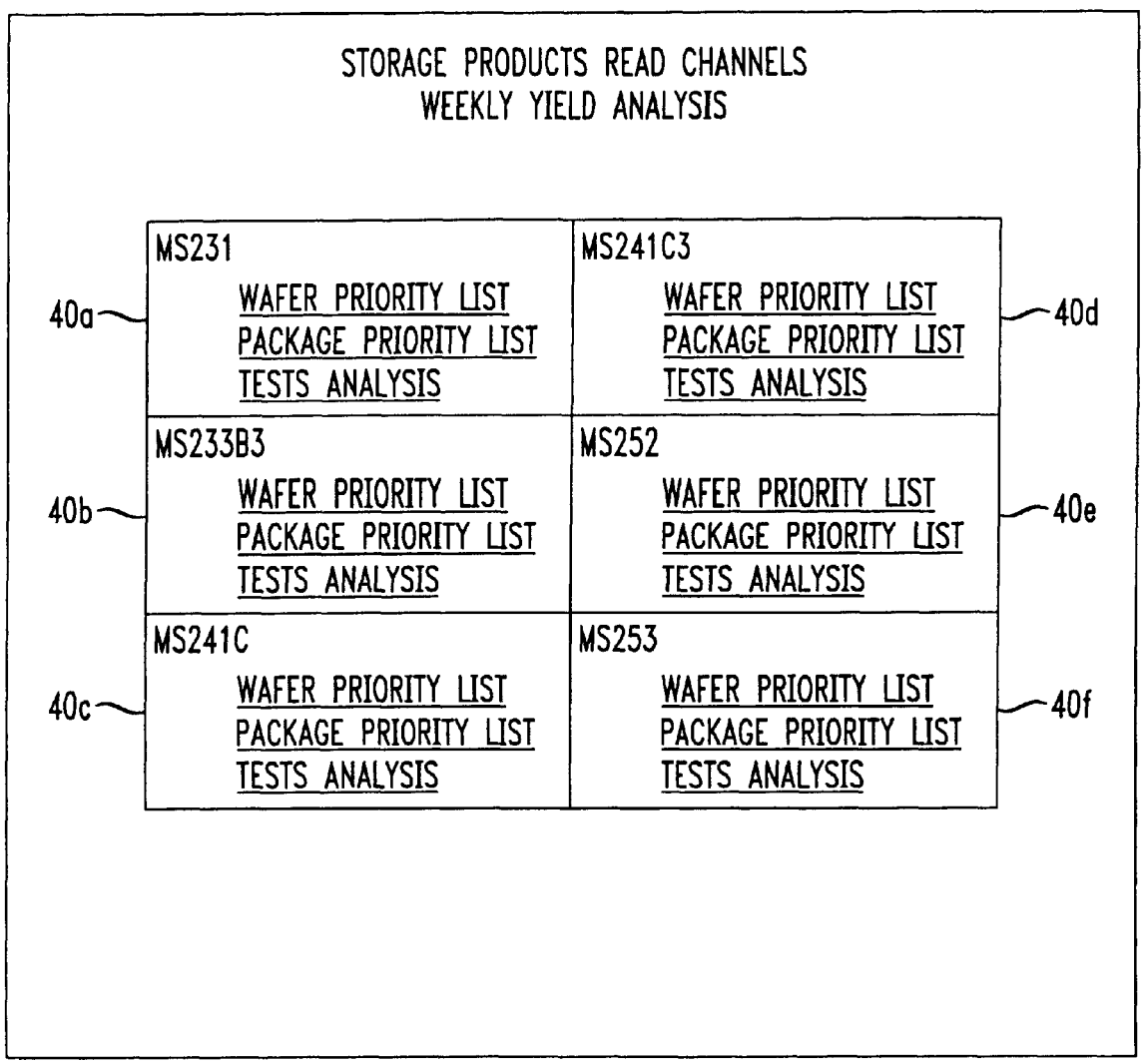
FIG. 2 is a web page for accessing a database of test data in accordance with the present invention.

Access to the database may be localized, i.e., within a semiconductor manufacturing facility, or worldwide, i.e., via the Internet. One version of a web page format for accessing the database is illustrated in FIG. 2. Each block 40a–40f represents a particular device, which may be referred to as a read channel. Within each block, one of three selections is possible: a list of wafer level prioritized tests, a list of package level prioritized tests, and graphically generated test analysis. A sample list of wafer level prioritized tests are illustrated in FIG. 3. The information is provided for two different manufacturing facilities: Orlando and Madrid, for example. Three columns are provided for the wafer level prioritized tests. Column 42 provides the percent failure of a particular test identified in column 44, and a third column 46 indicates which lot of wafers failed the particular test. The same type and format of information would also be presented for a list of package level prioritized tests.

The method according to the present invention advantageously performs a detailed comparison between wafer level testing and package level testing of the wafers. Benchmarking of the wafer processing facilities that produce a particular device is also done and presented throughout the plots. It is important to note that the database stores the statistics of the test results. At package level the unit of comparison is the package lot. In other words, package level data generally do not include individual wafer numbers. Consequently, the package level data is stored in the database by wafer lot. At wafer level the data stored is per individual wafer. To compare wafer level and package level results the minimum common unit is used, which is a wafer lot.

Example plots and their interpretation will now be discussed with reference to FIGS. 4–10. In some cases the cause of the yield drop will be identified. In all cases the analysis will tell which parameters are not causing the problem. Each of the following plots are made available through postscript files accessible through the web page illustrated in FIG. 2.

Figure 4:
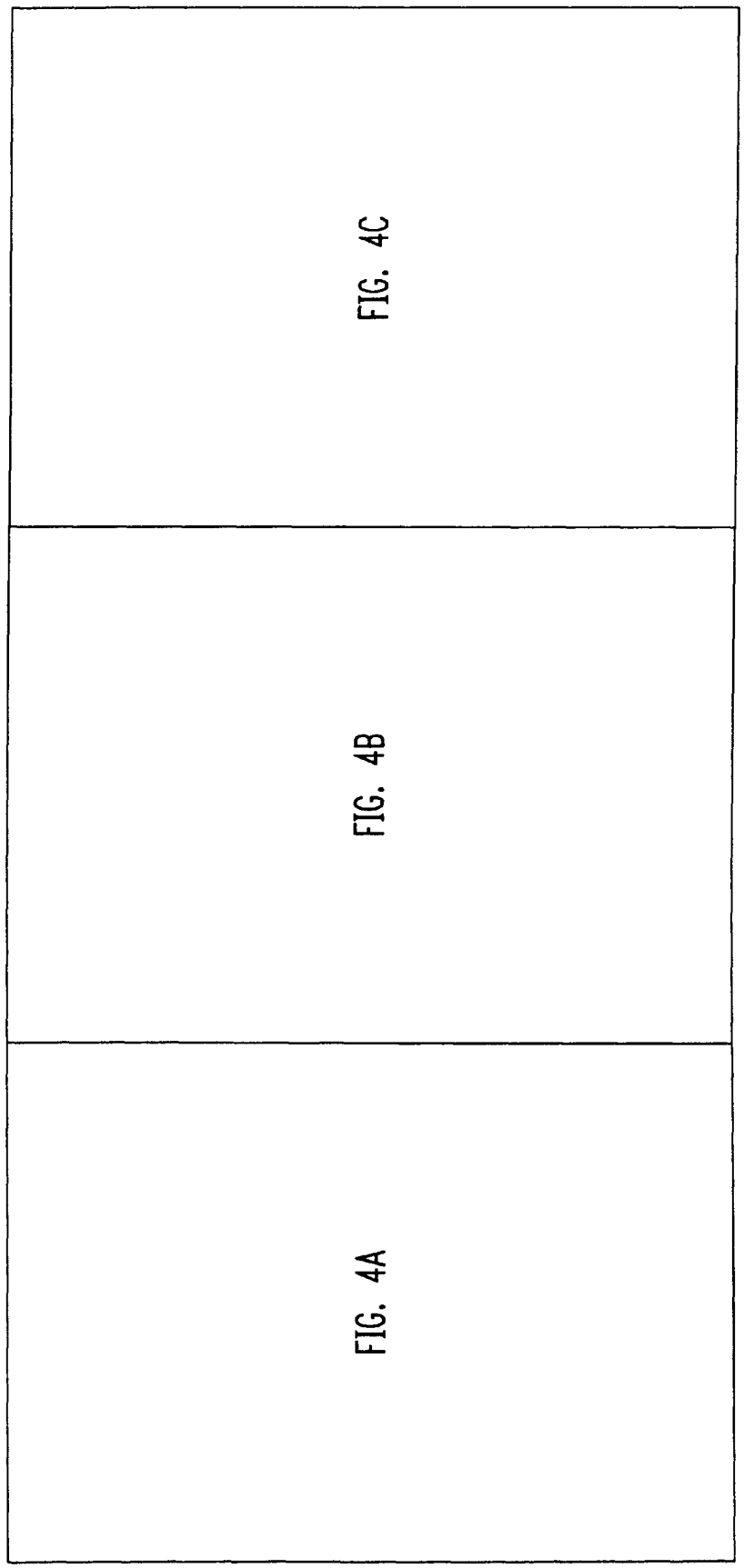
Figure 4A:
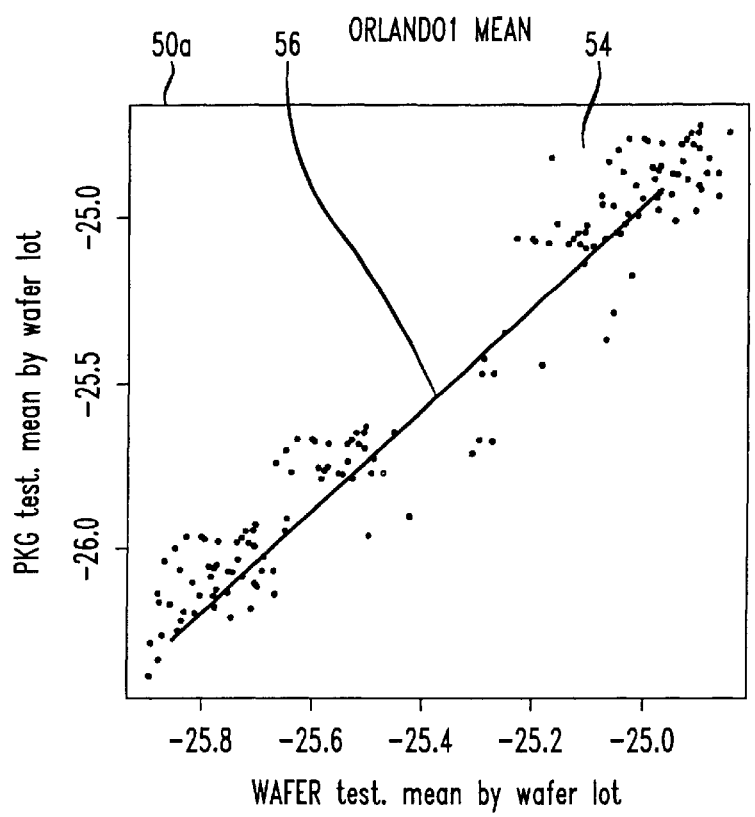
Figure 4A:
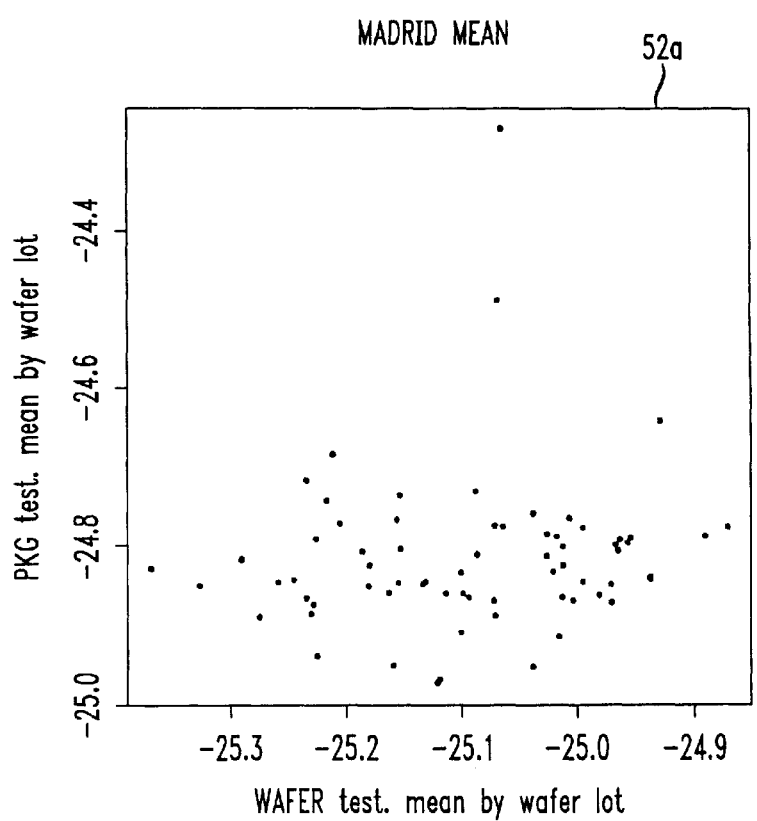
Figure 4B:
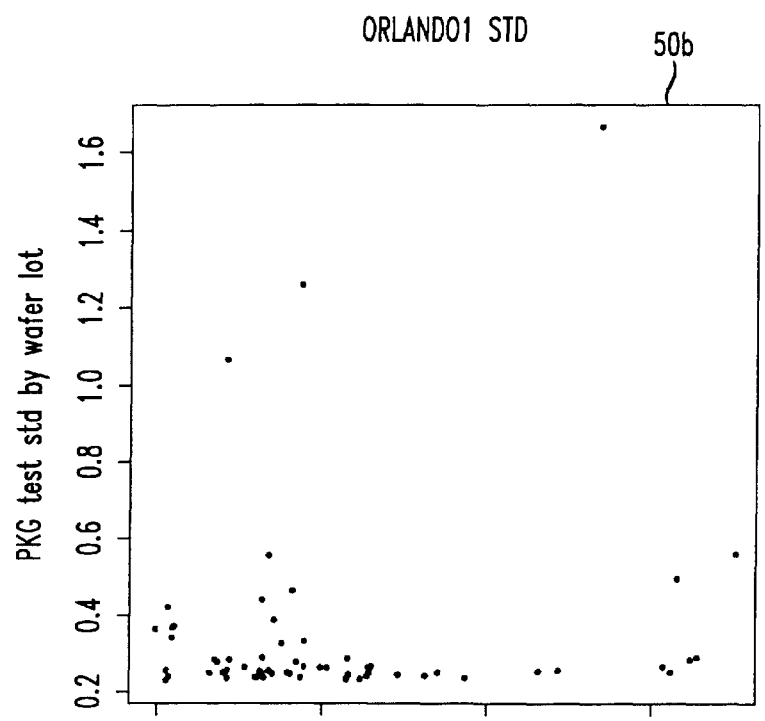
Figure 4B:
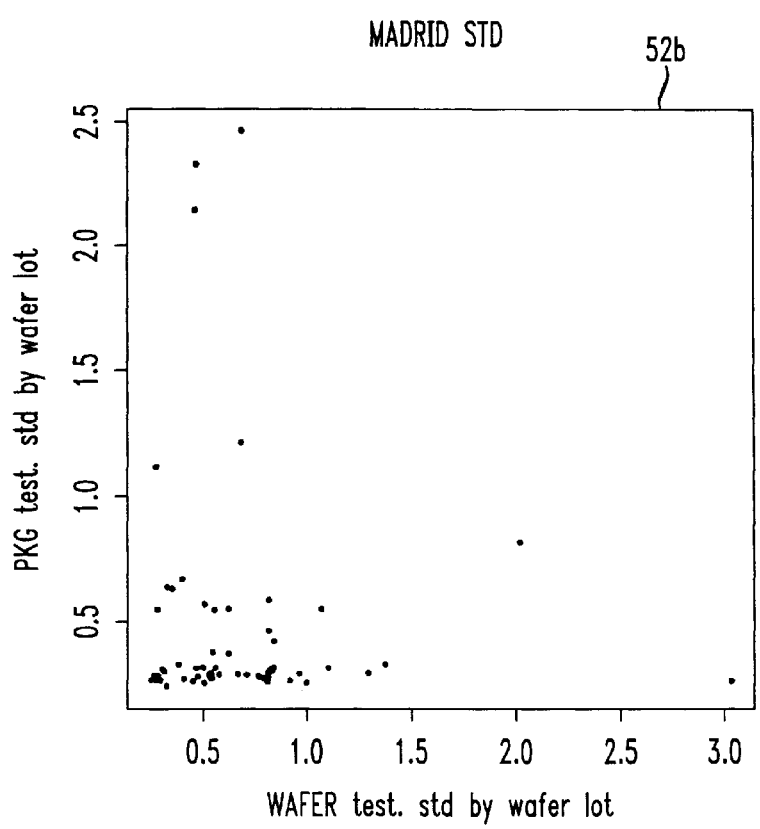
Figure 4C:
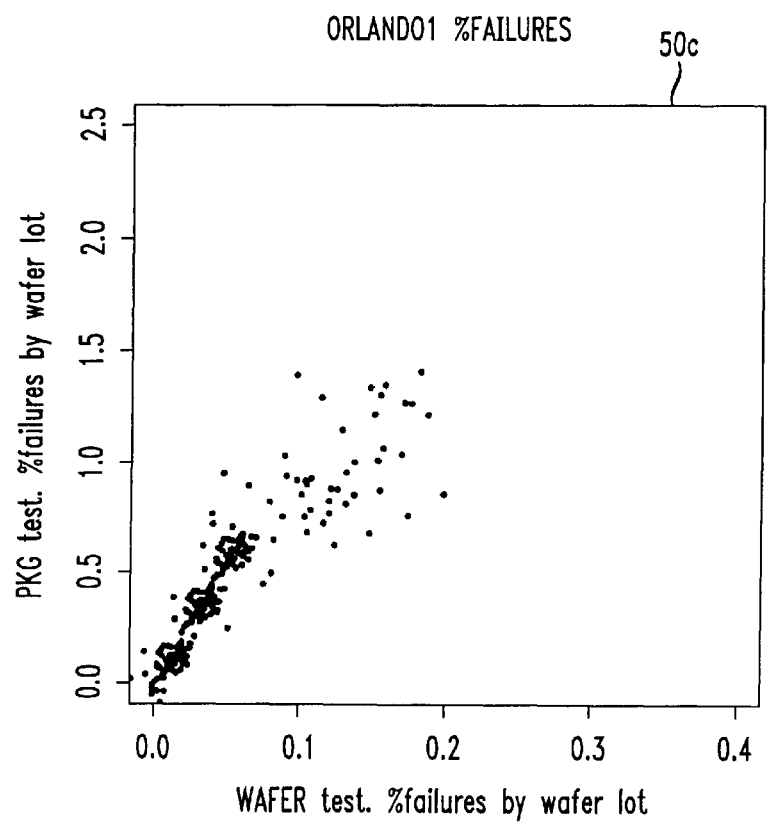
Figure 4C:
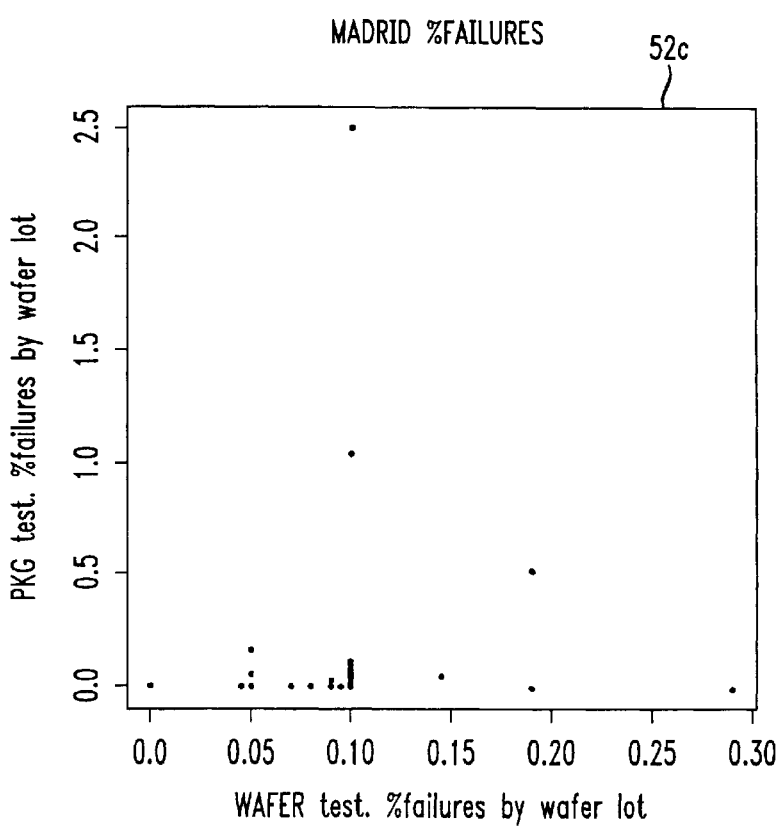
Figure 5:
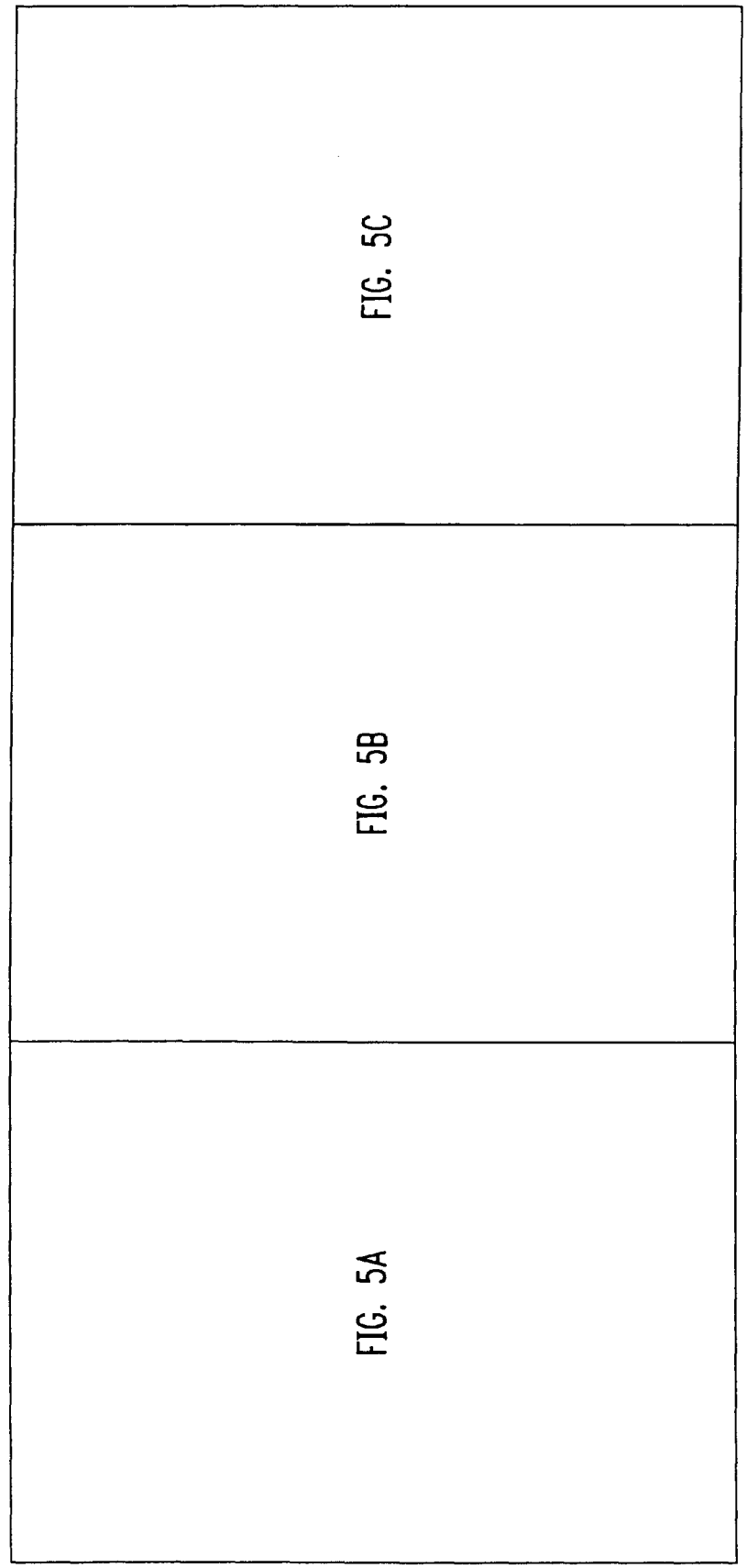
Figure 5A:
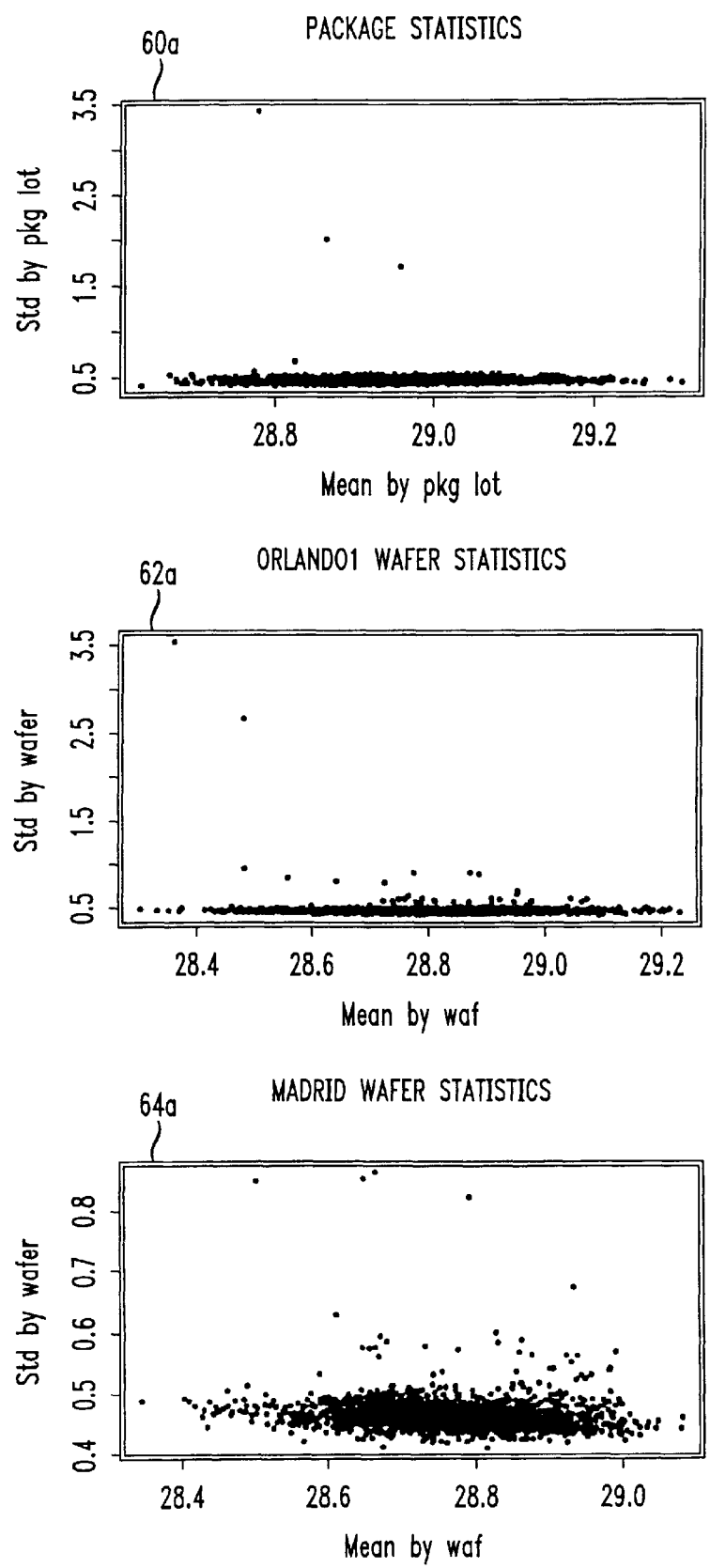
Figure 5B:
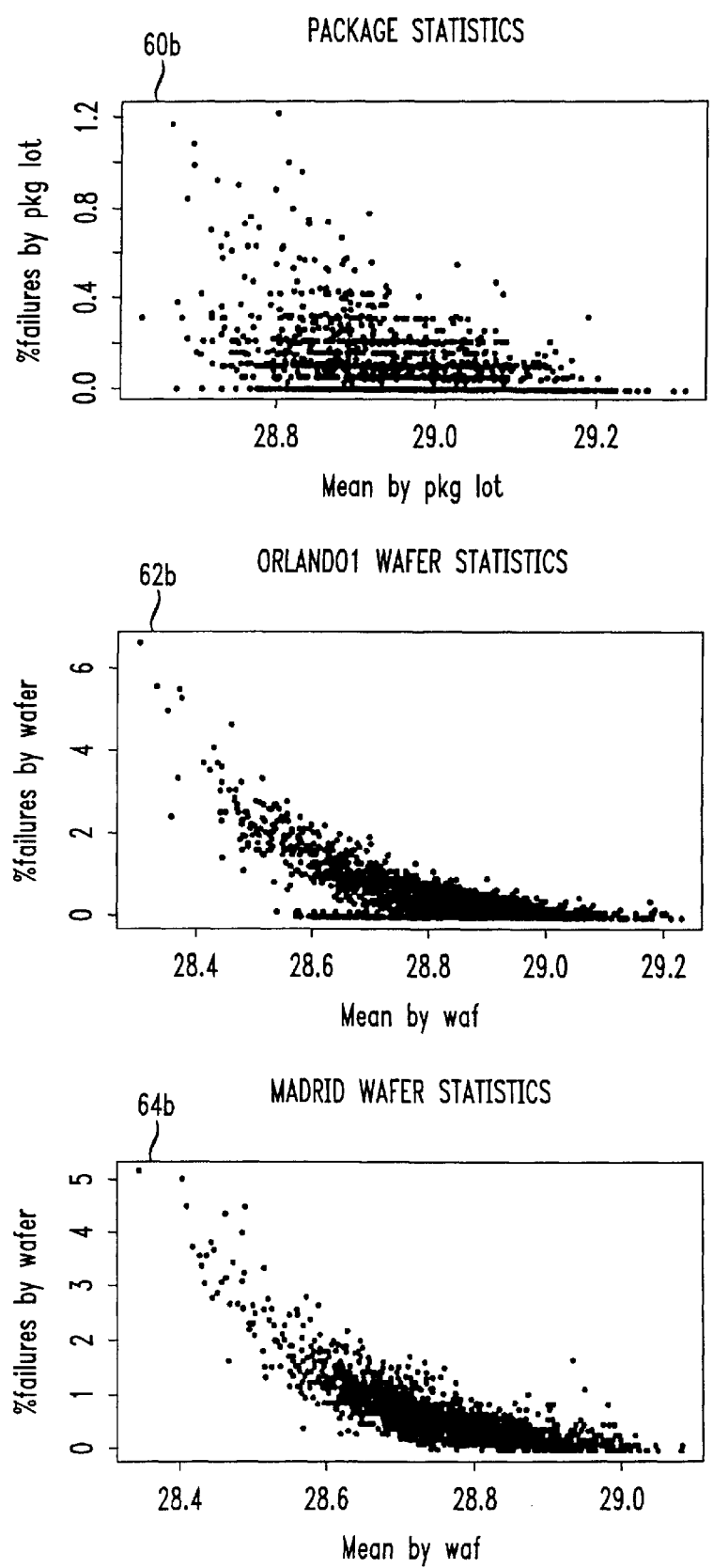
Figure 5C:
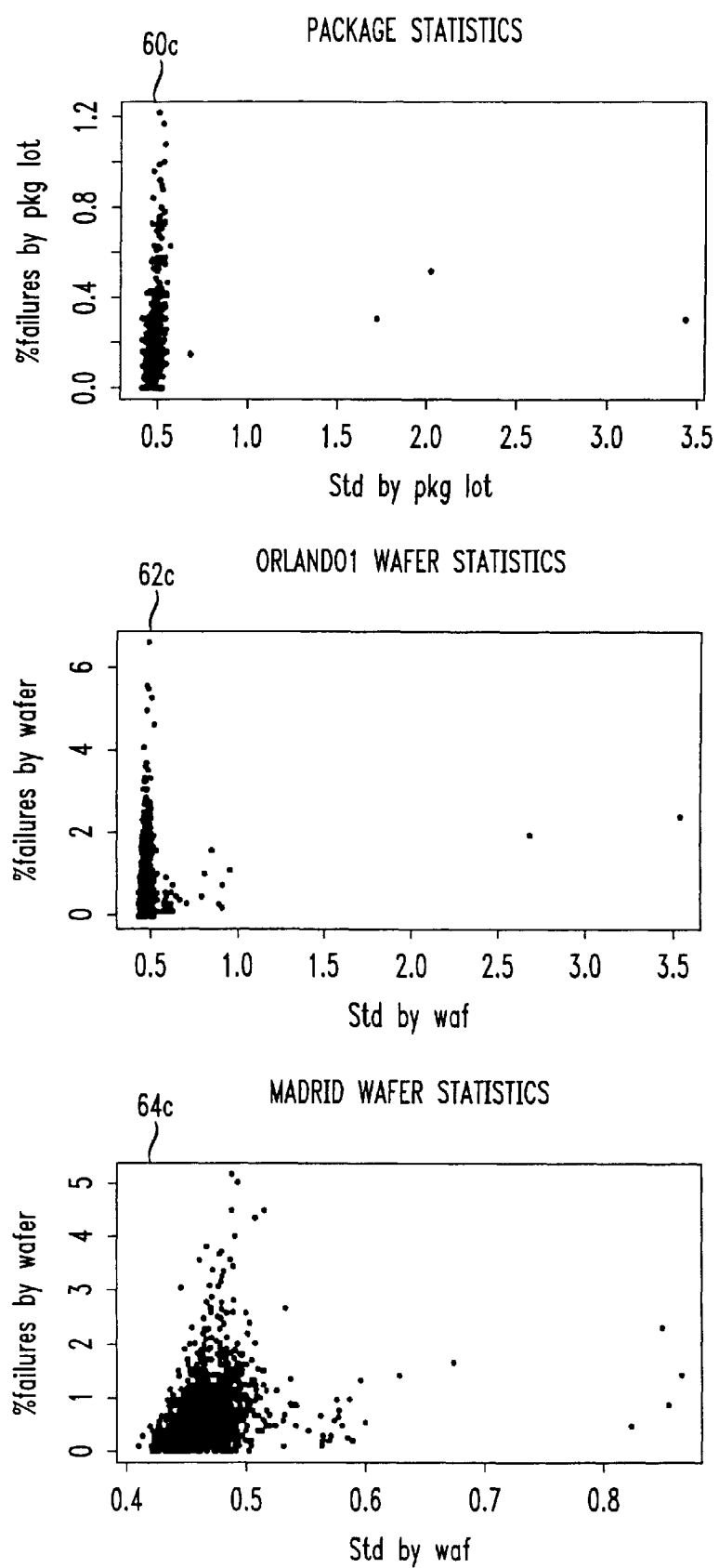
Figure 6A:
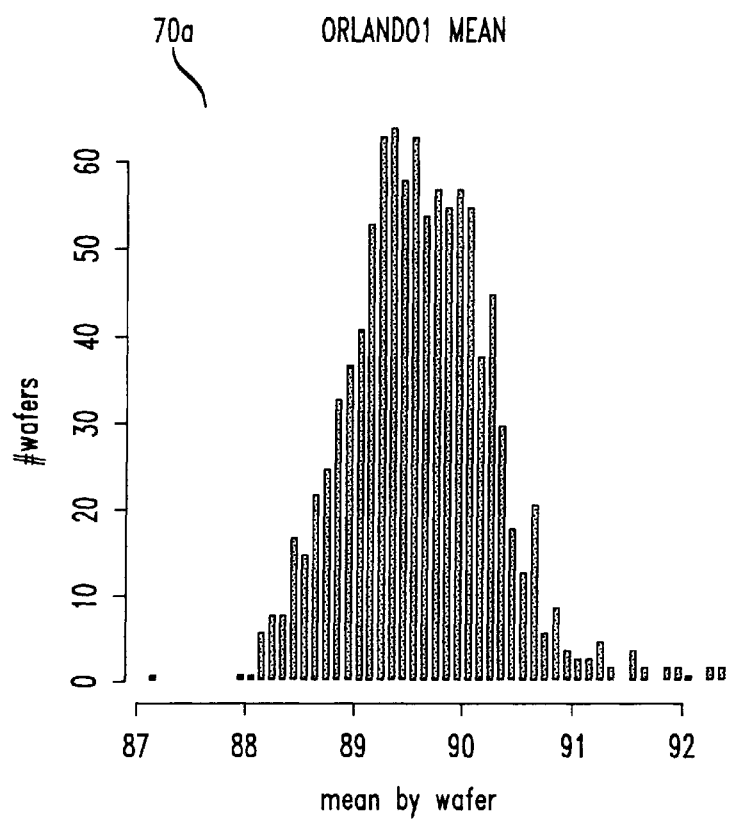
Figure 6A:
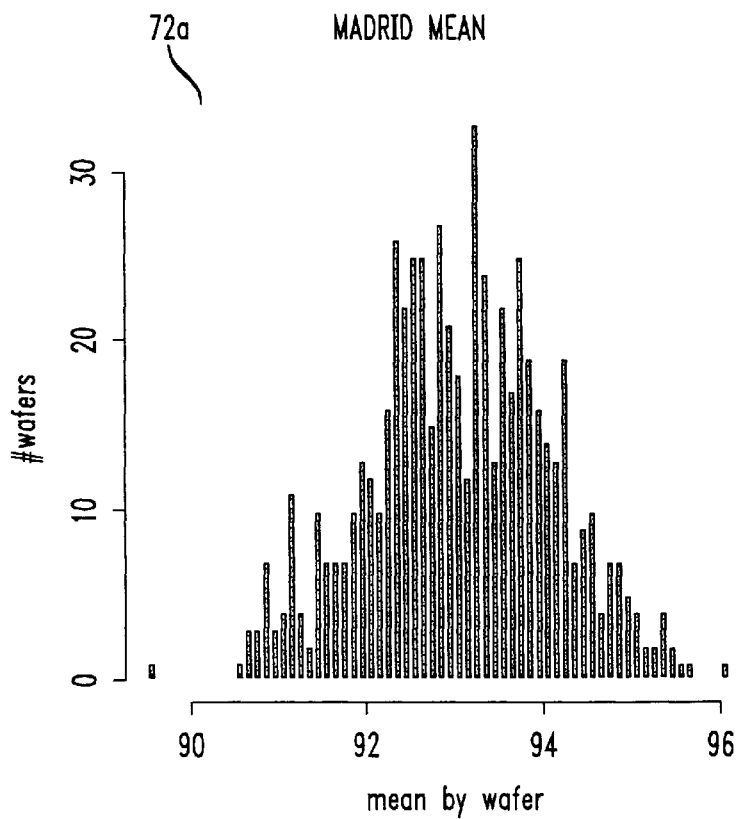
Figure 6B:
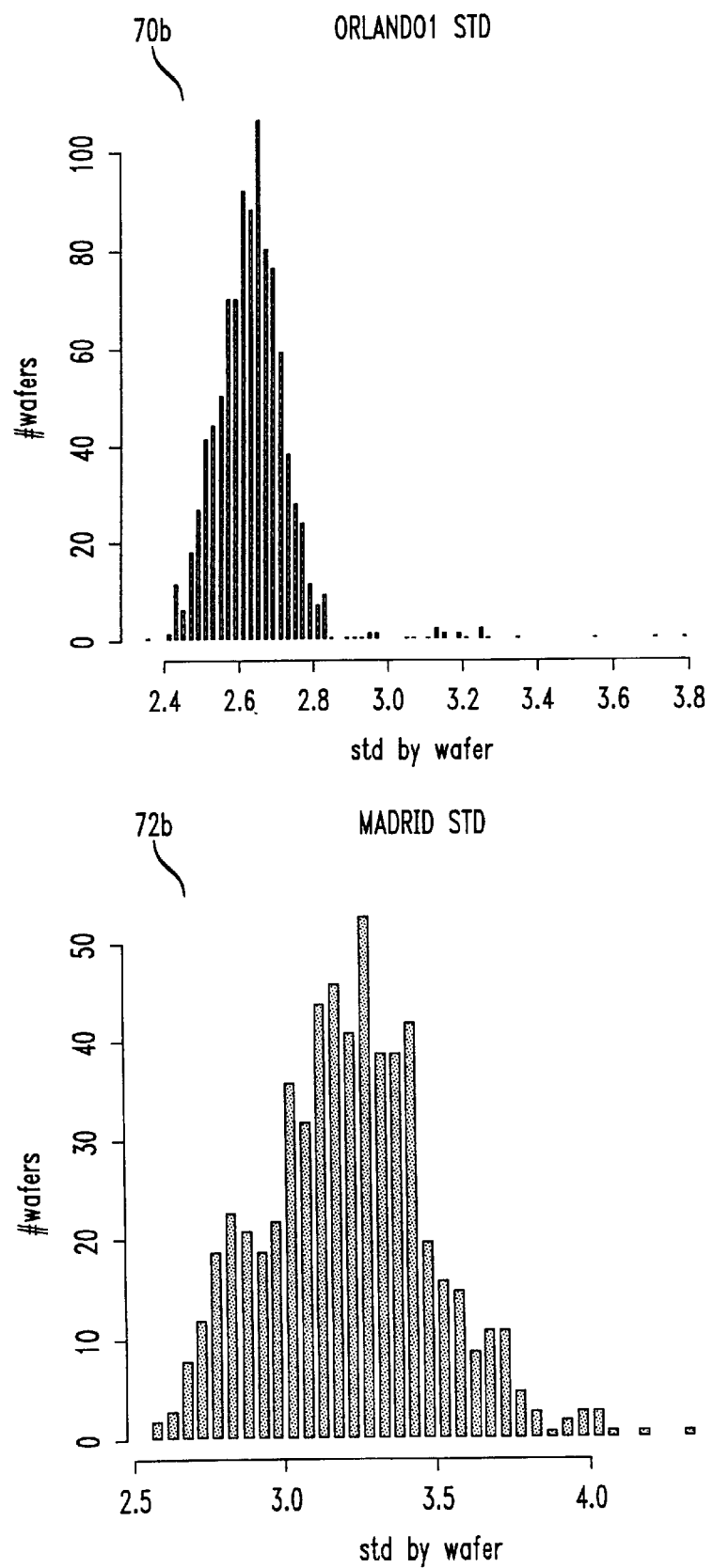
Figure 6C:
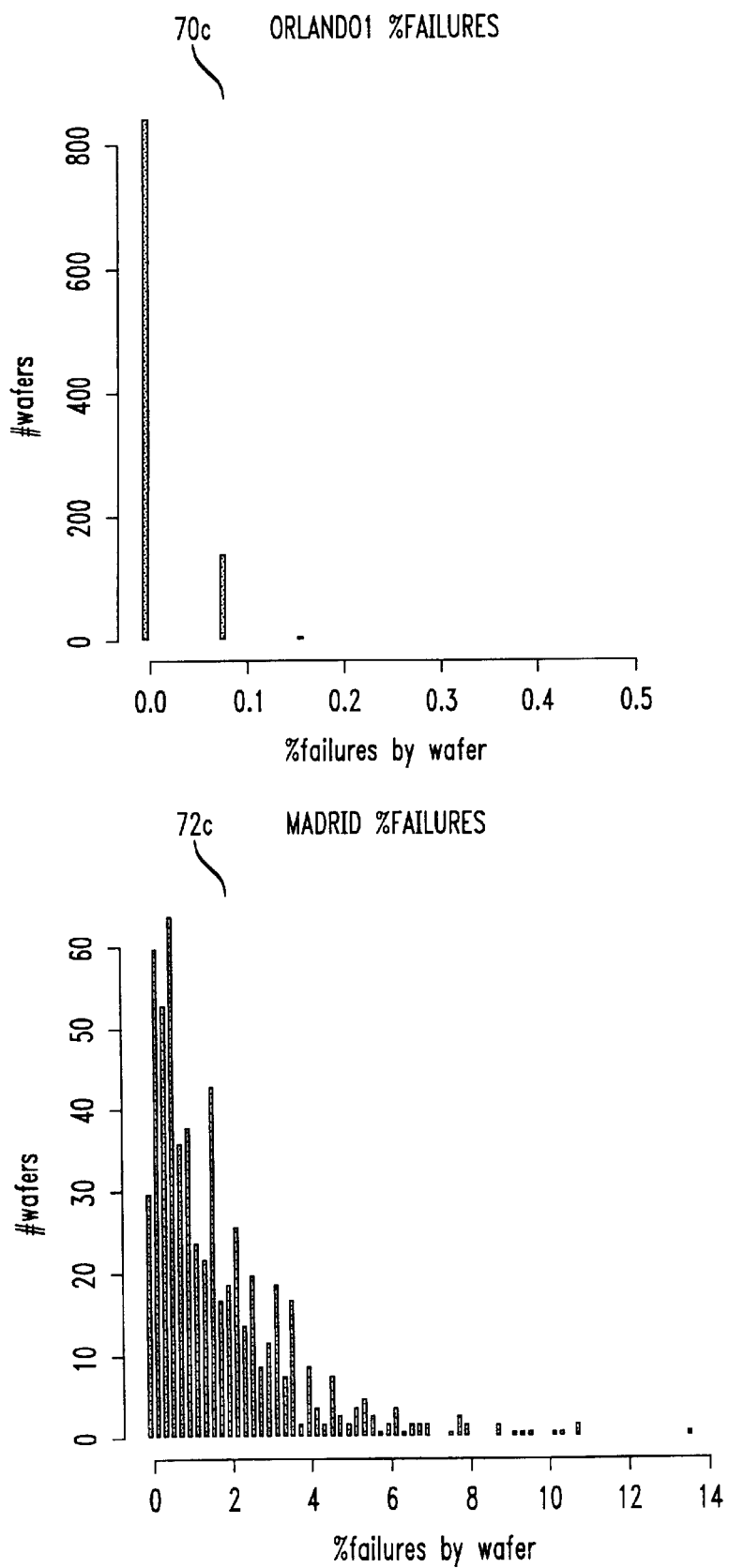
Figure 7:
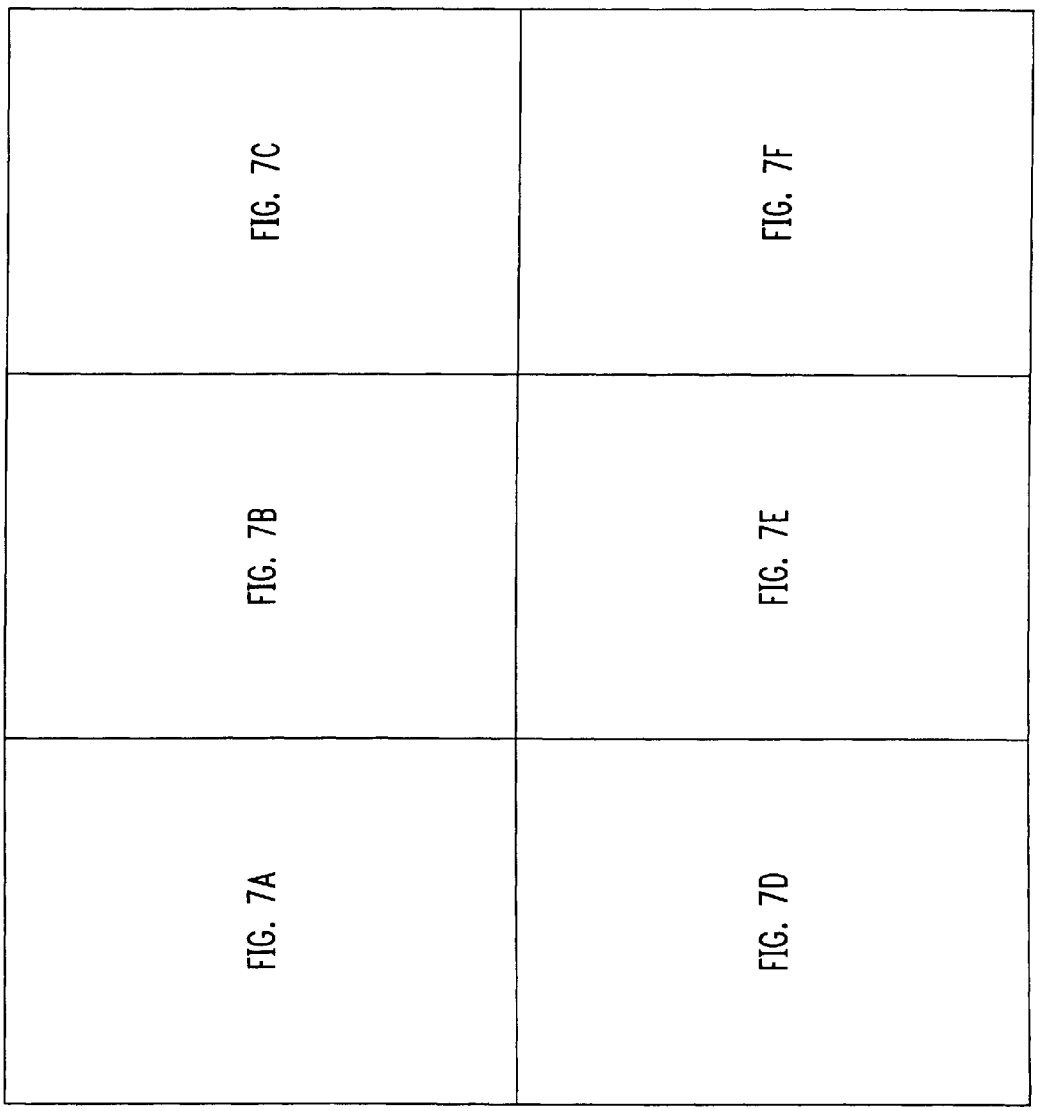
Figure 7A:
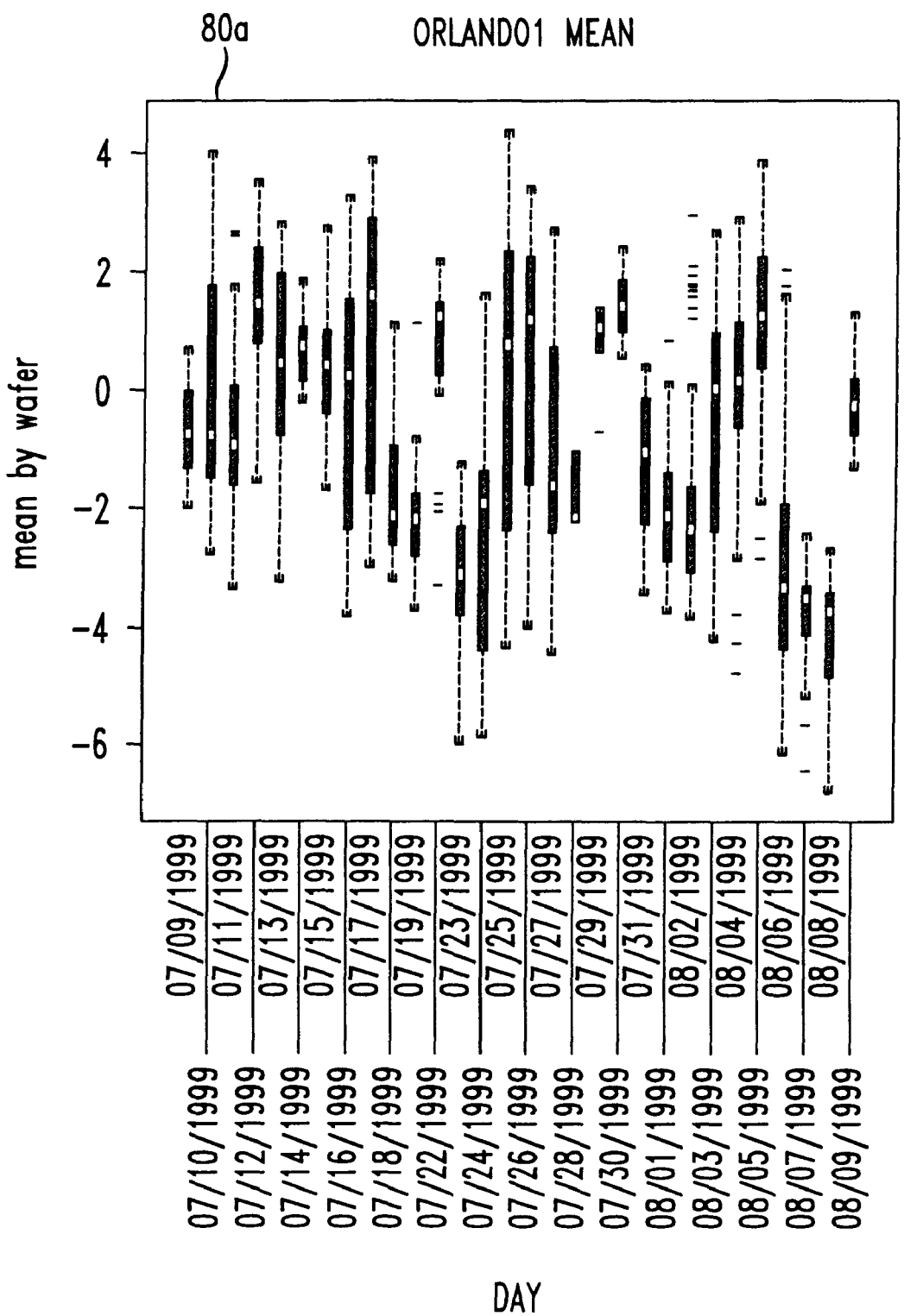
Figure 7B:
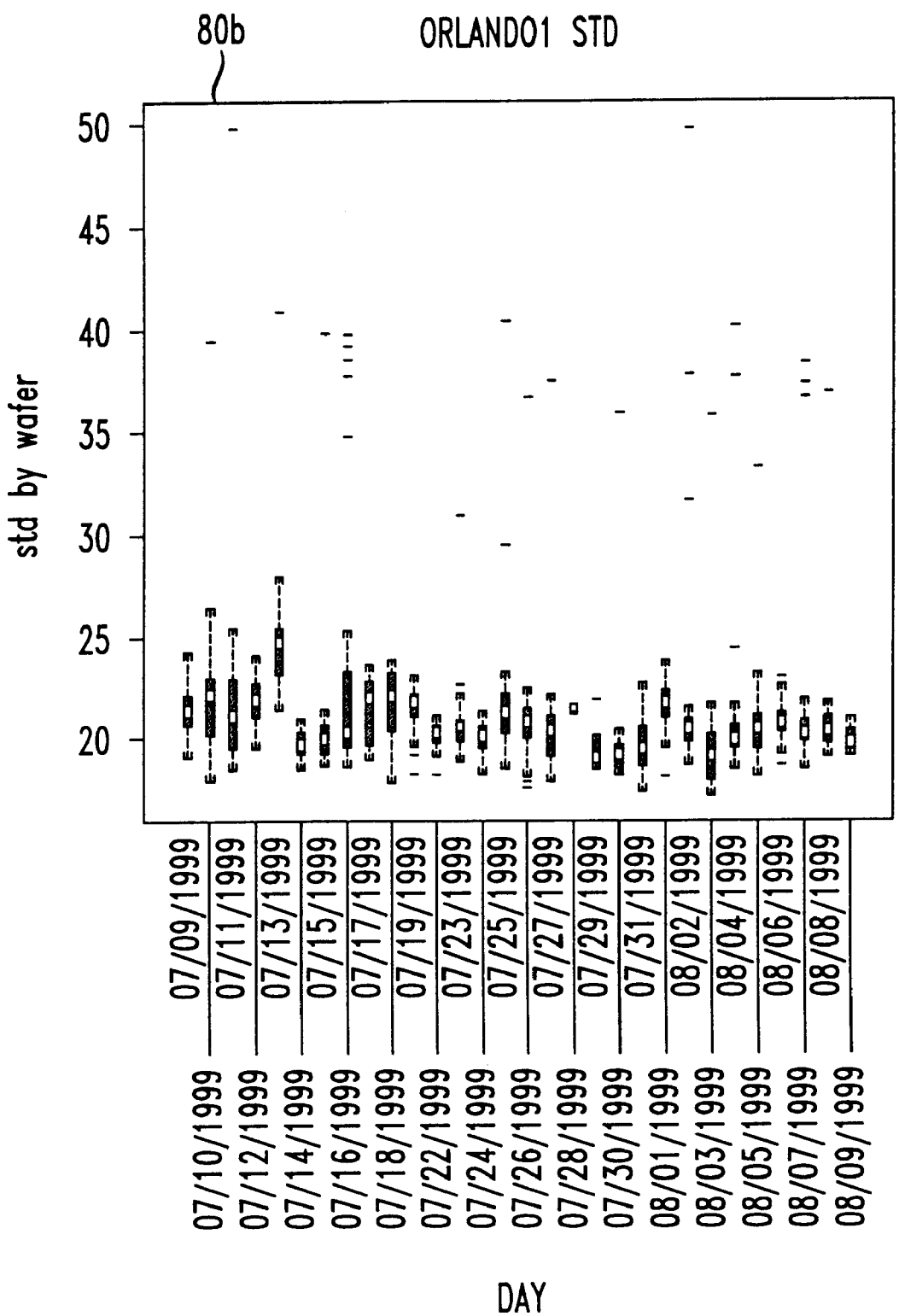
Figure 7C:
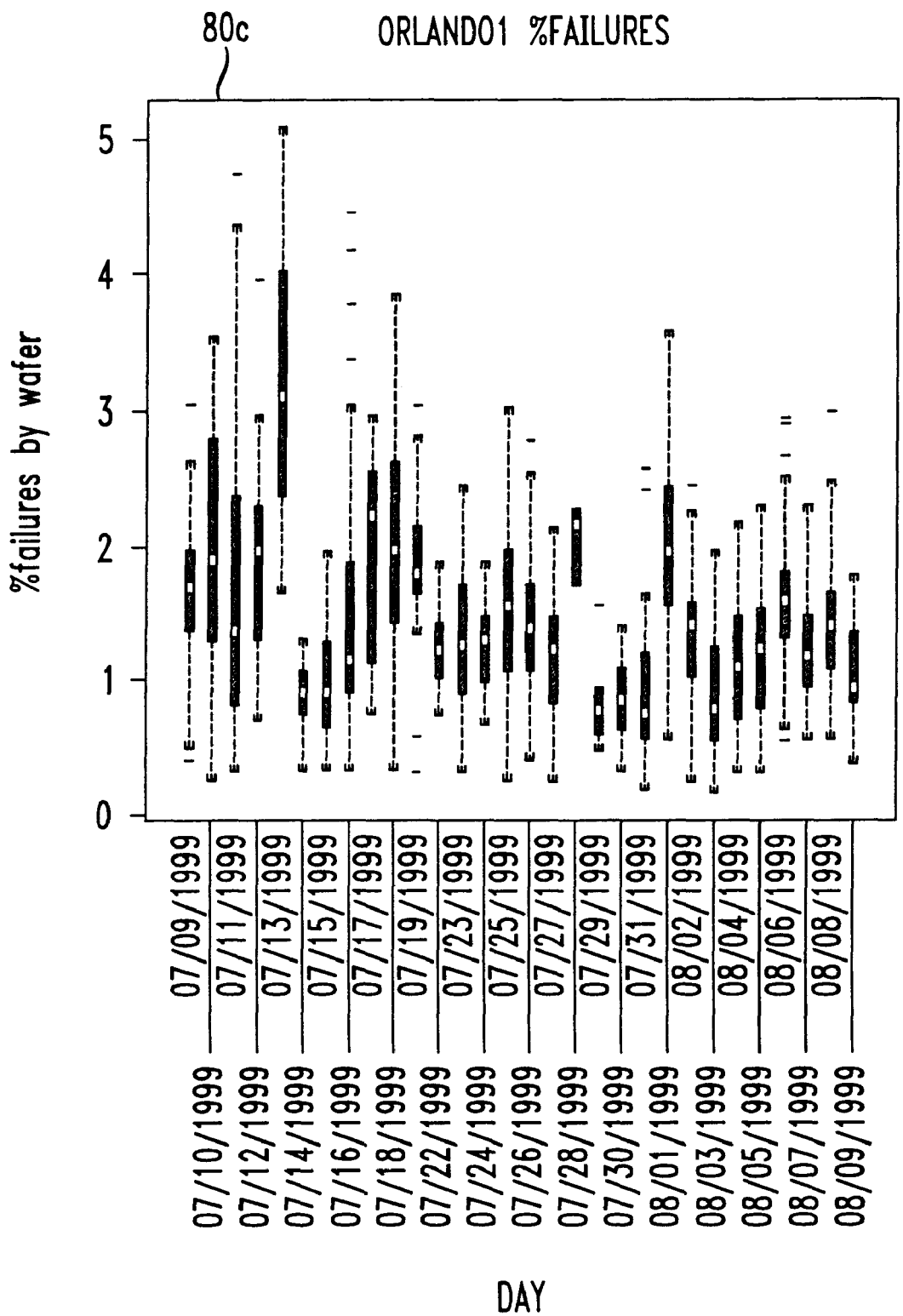
Figure 7D:
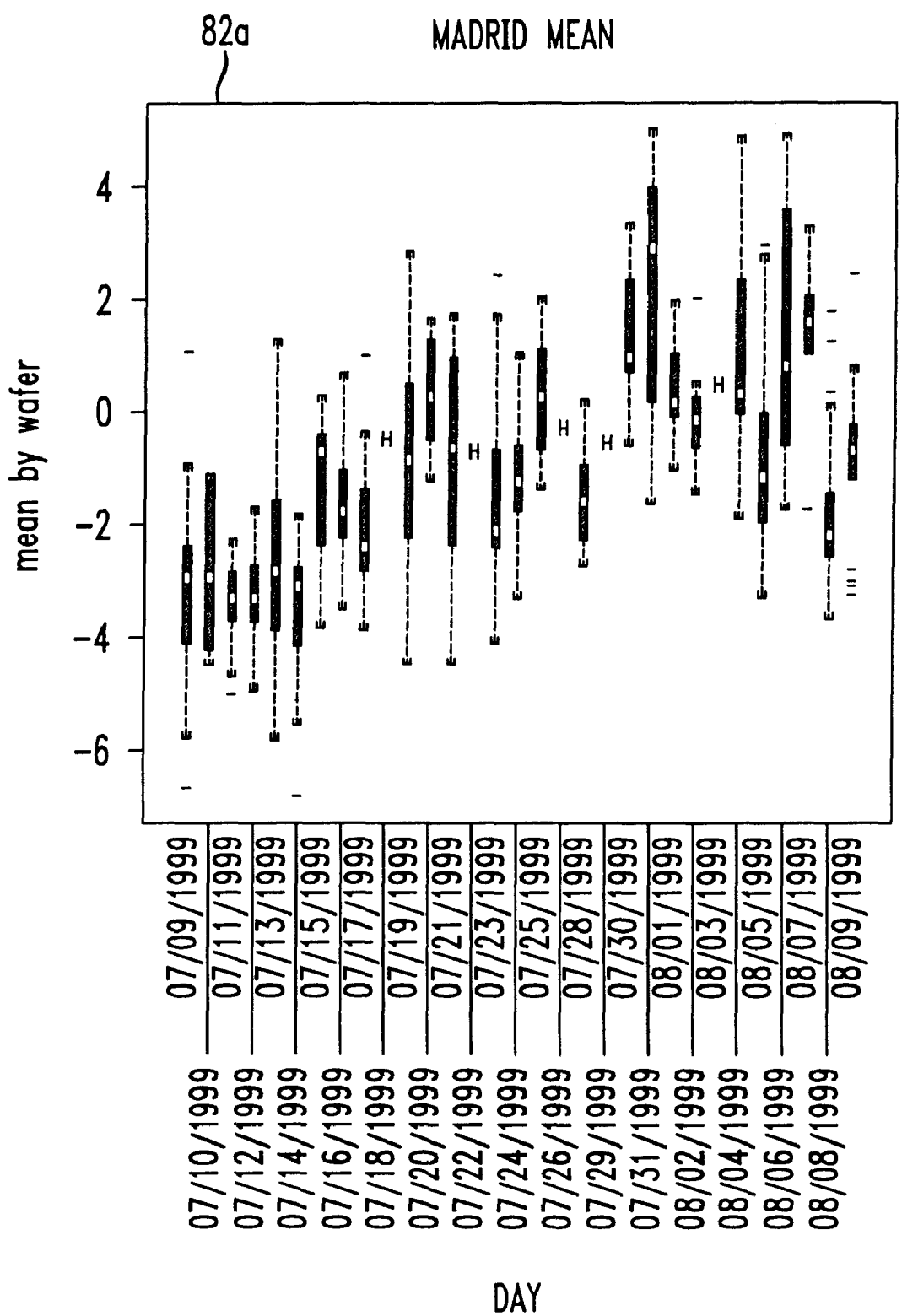
Figure 7E:
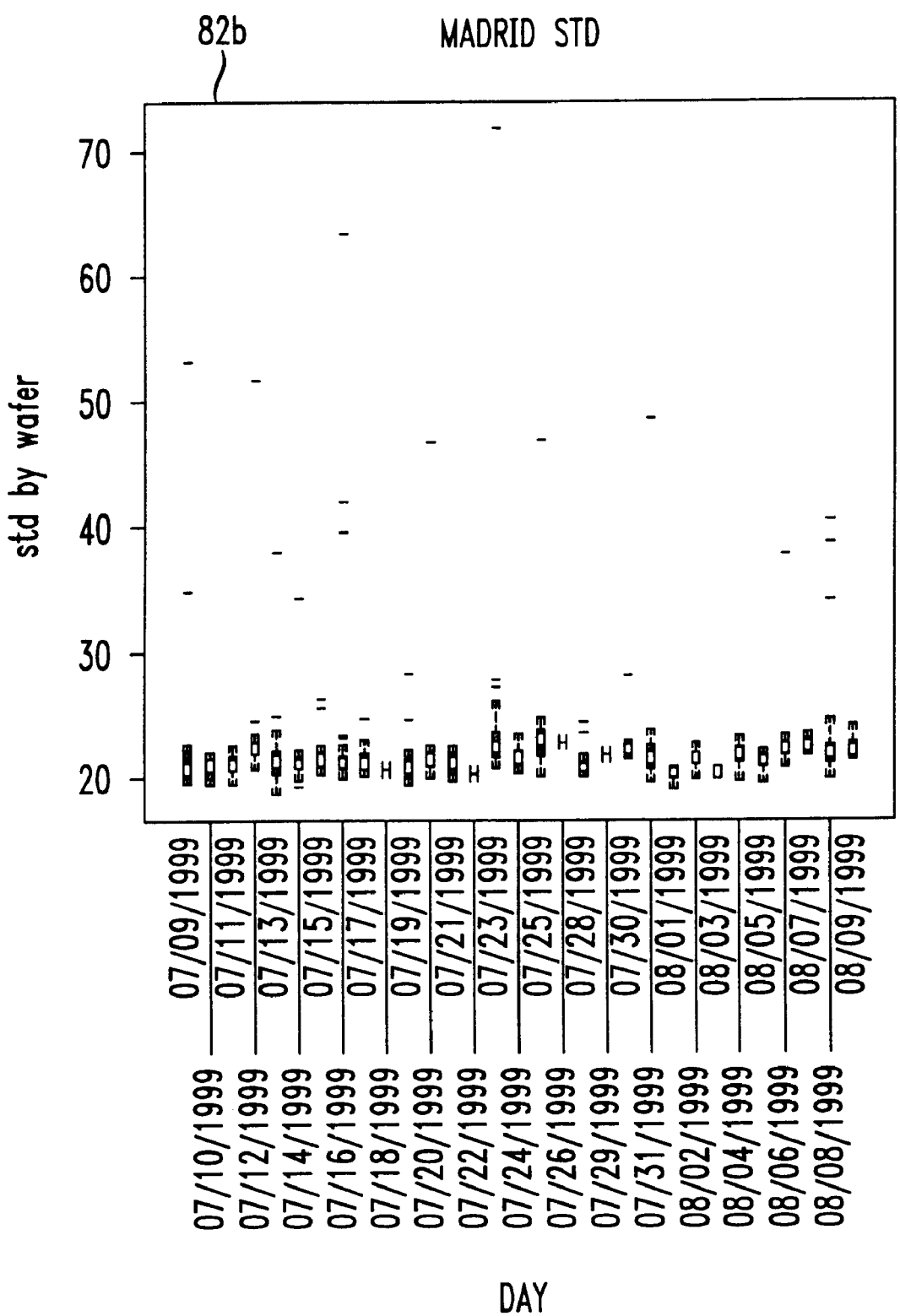
Figure 7F:
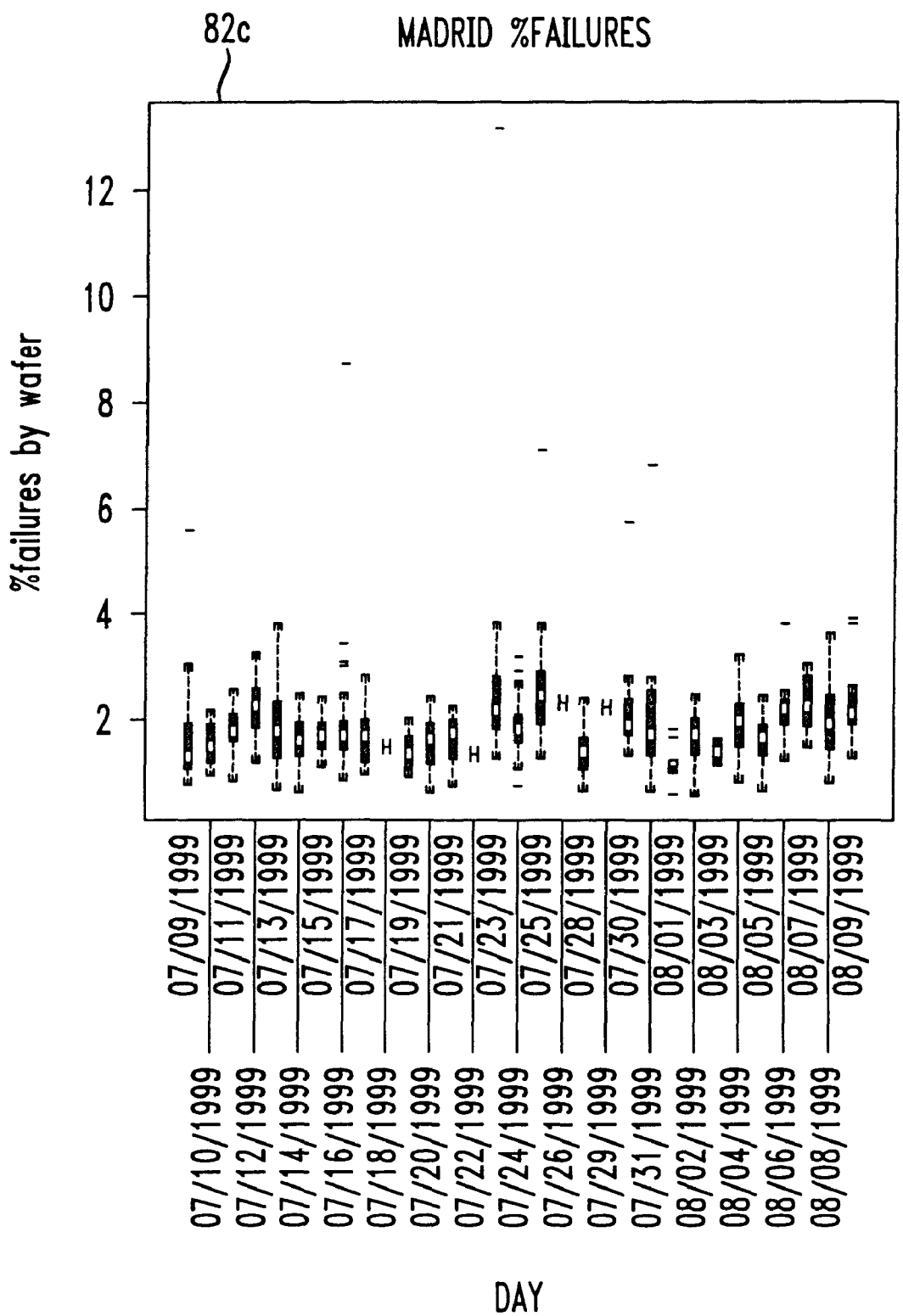
Figure 8:
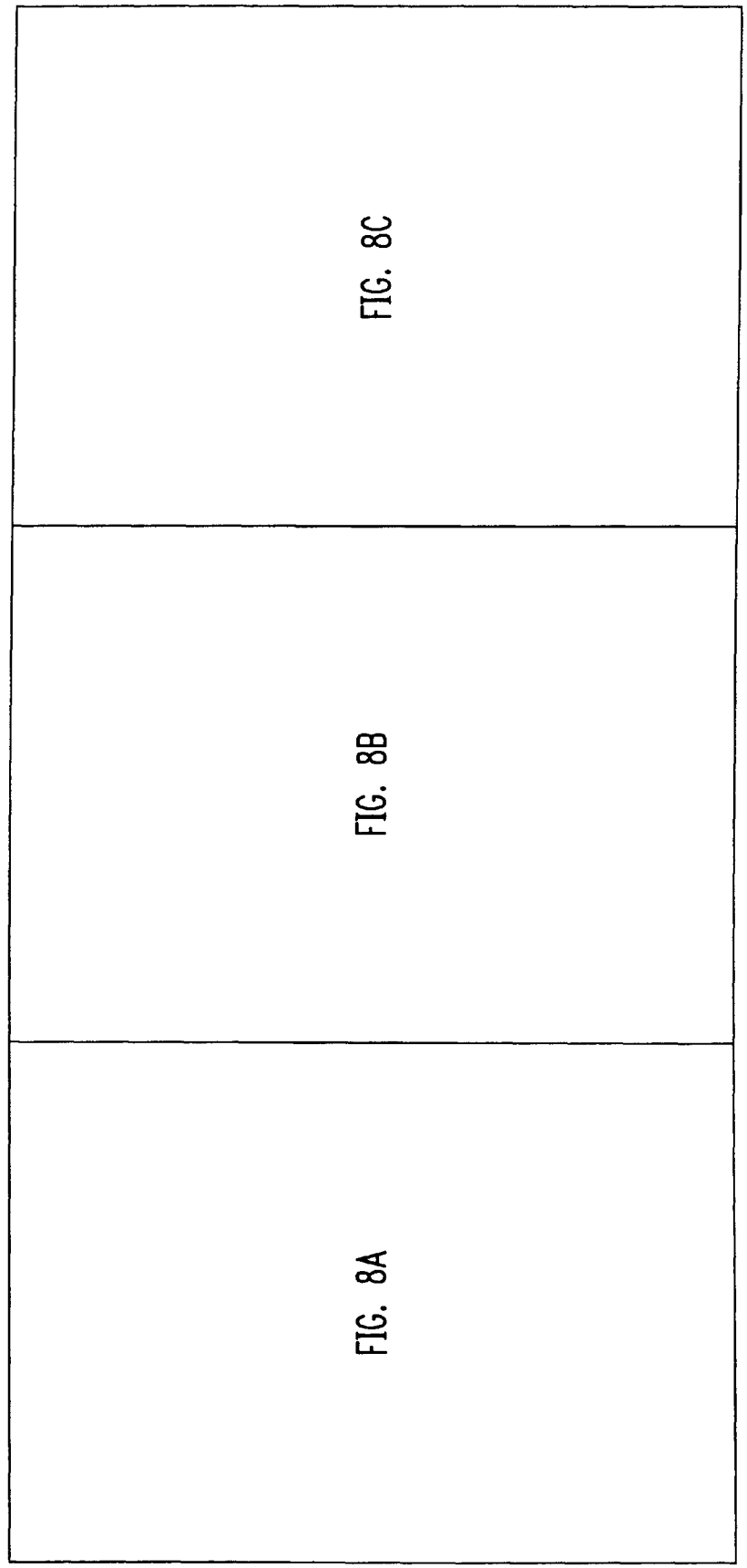
Figure 8A:
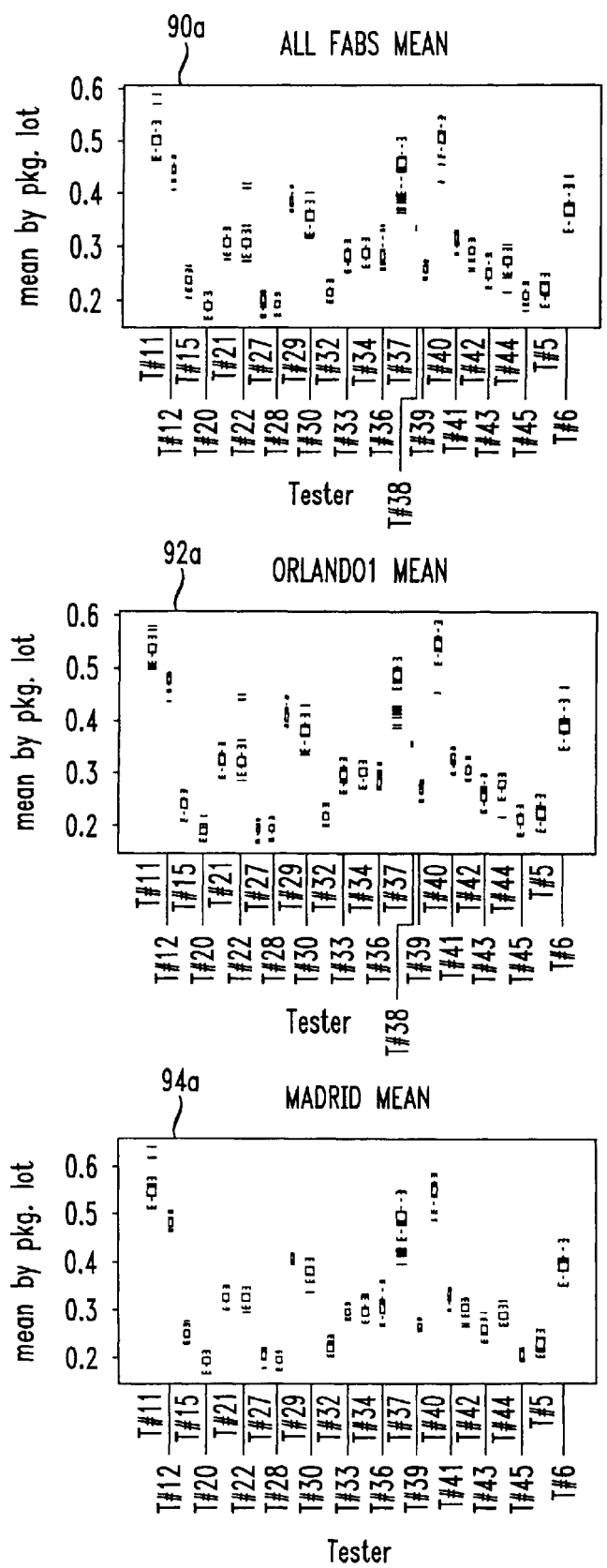
Figure 8B:
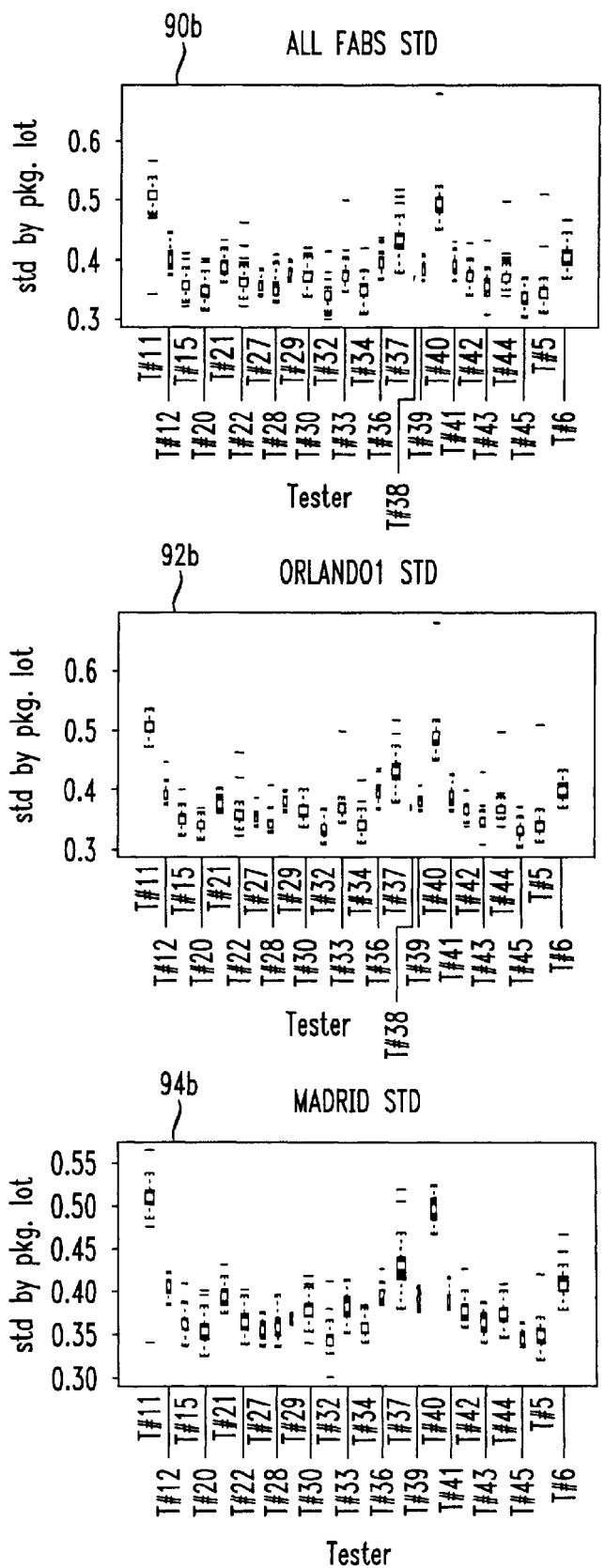
Figure 9:
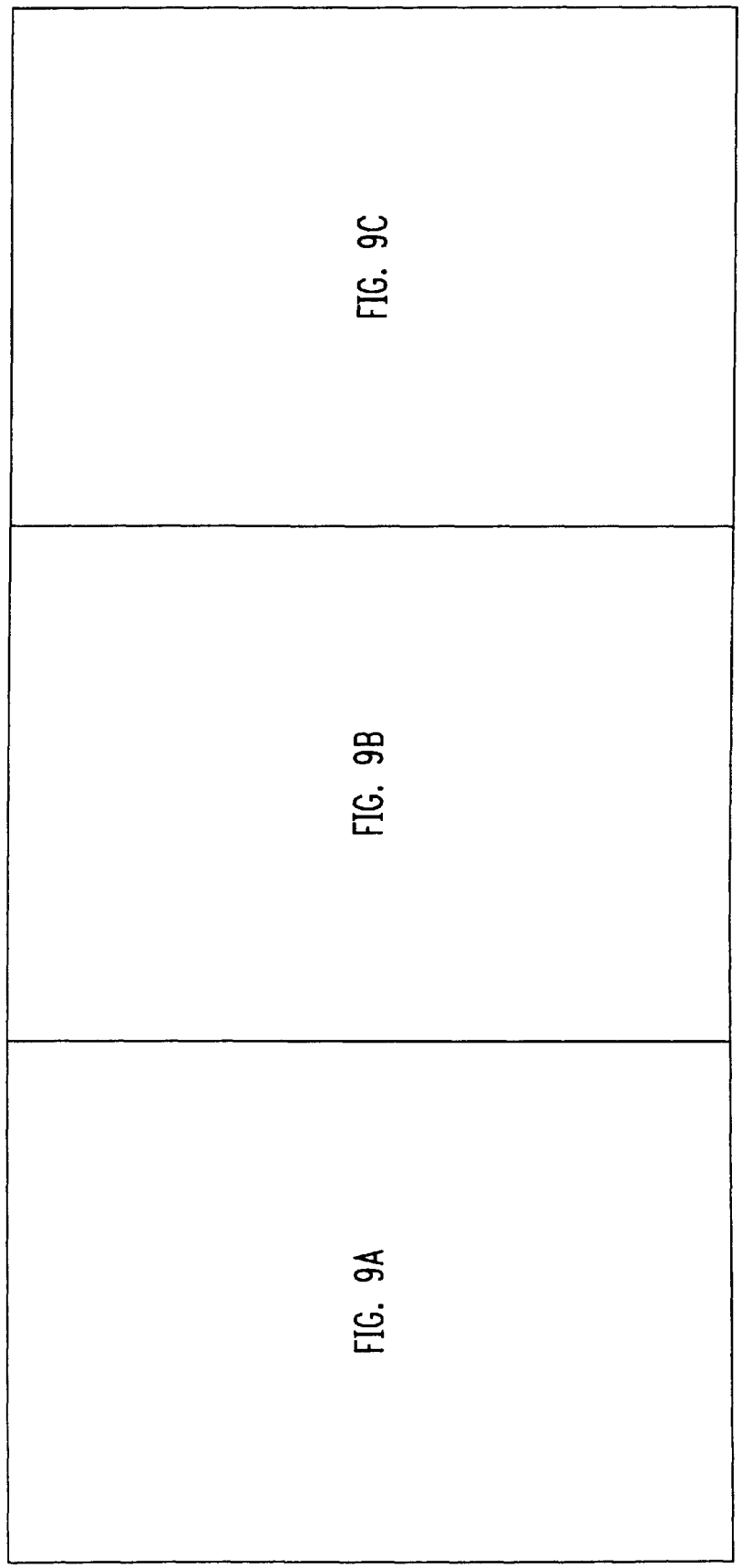
Figure 9A:
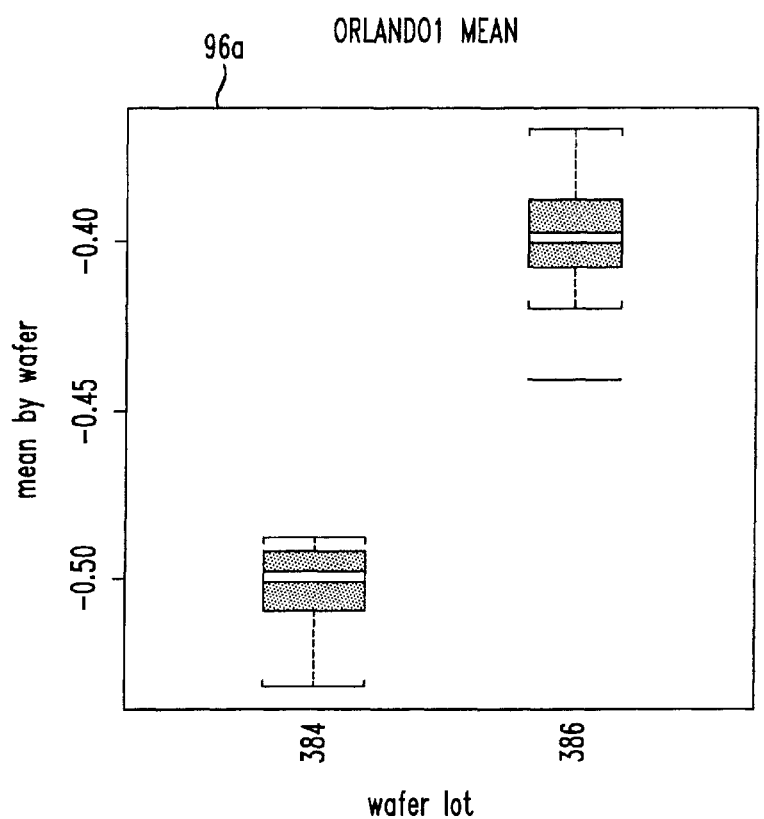
Figure 9A:
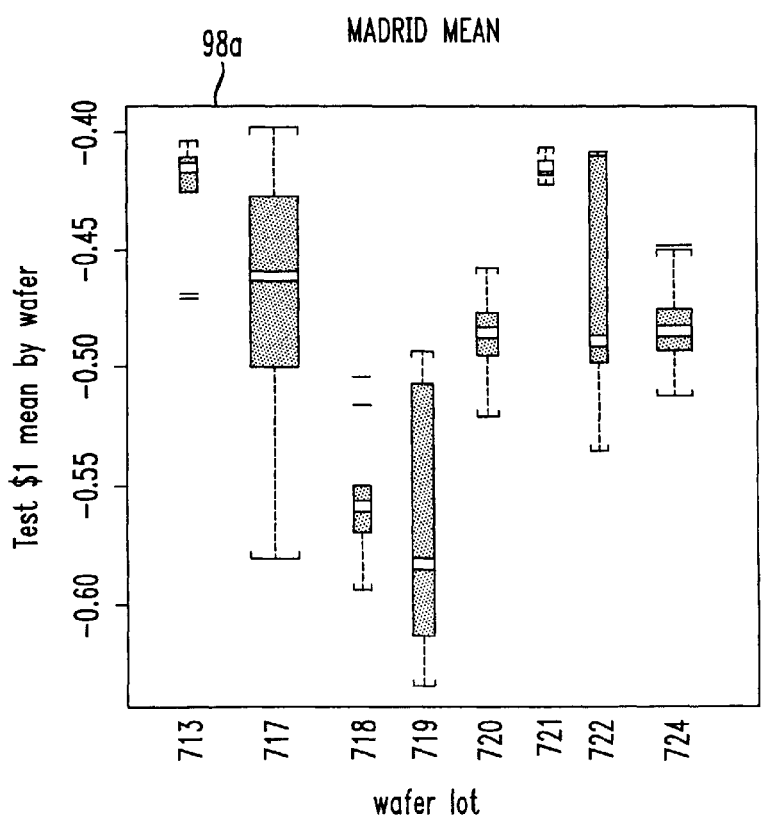
Figure 9B:
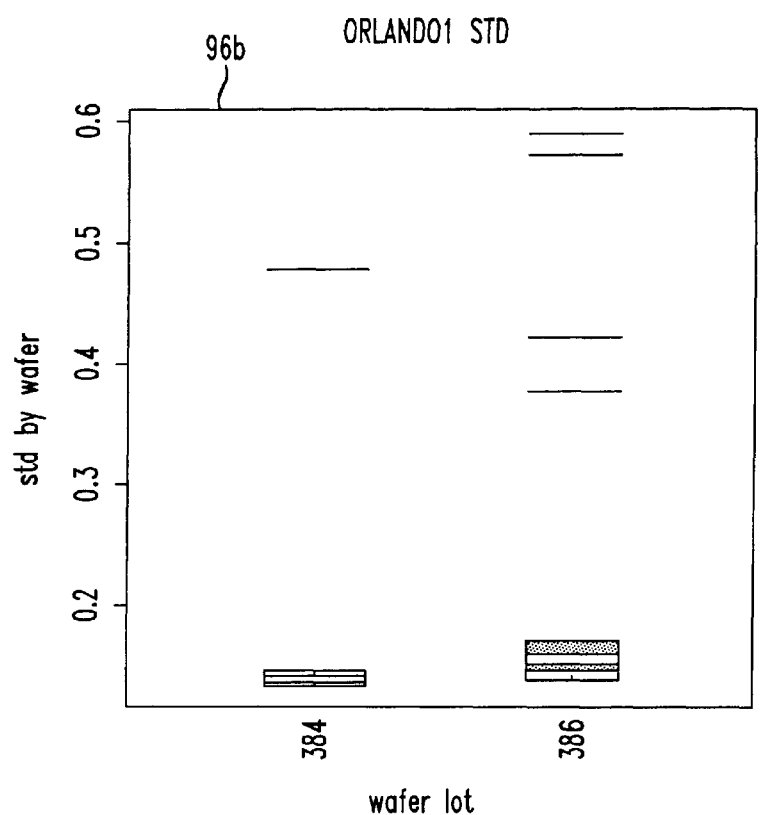
Figure 9B:
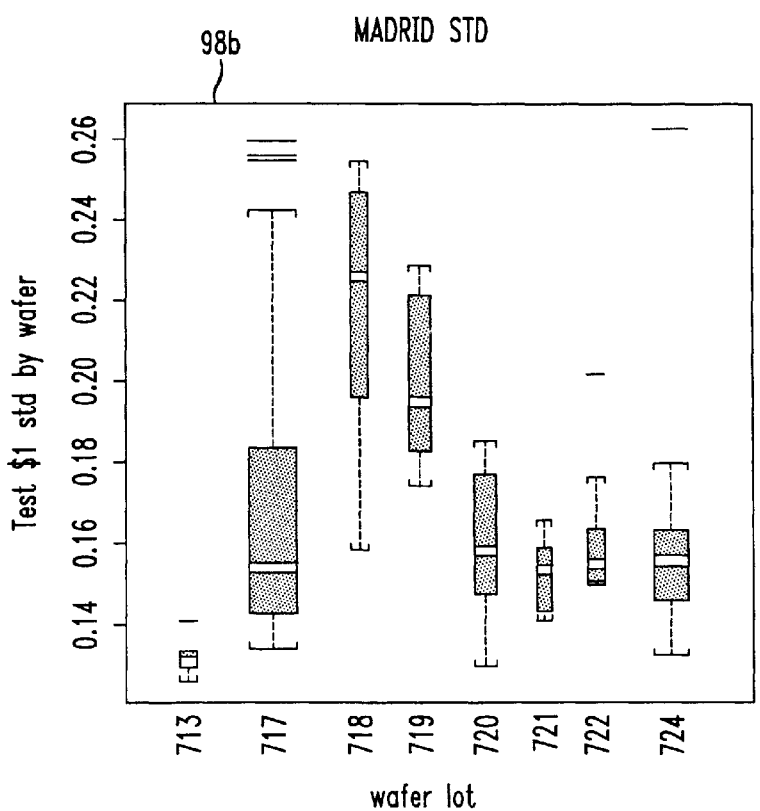
Figure 9C:
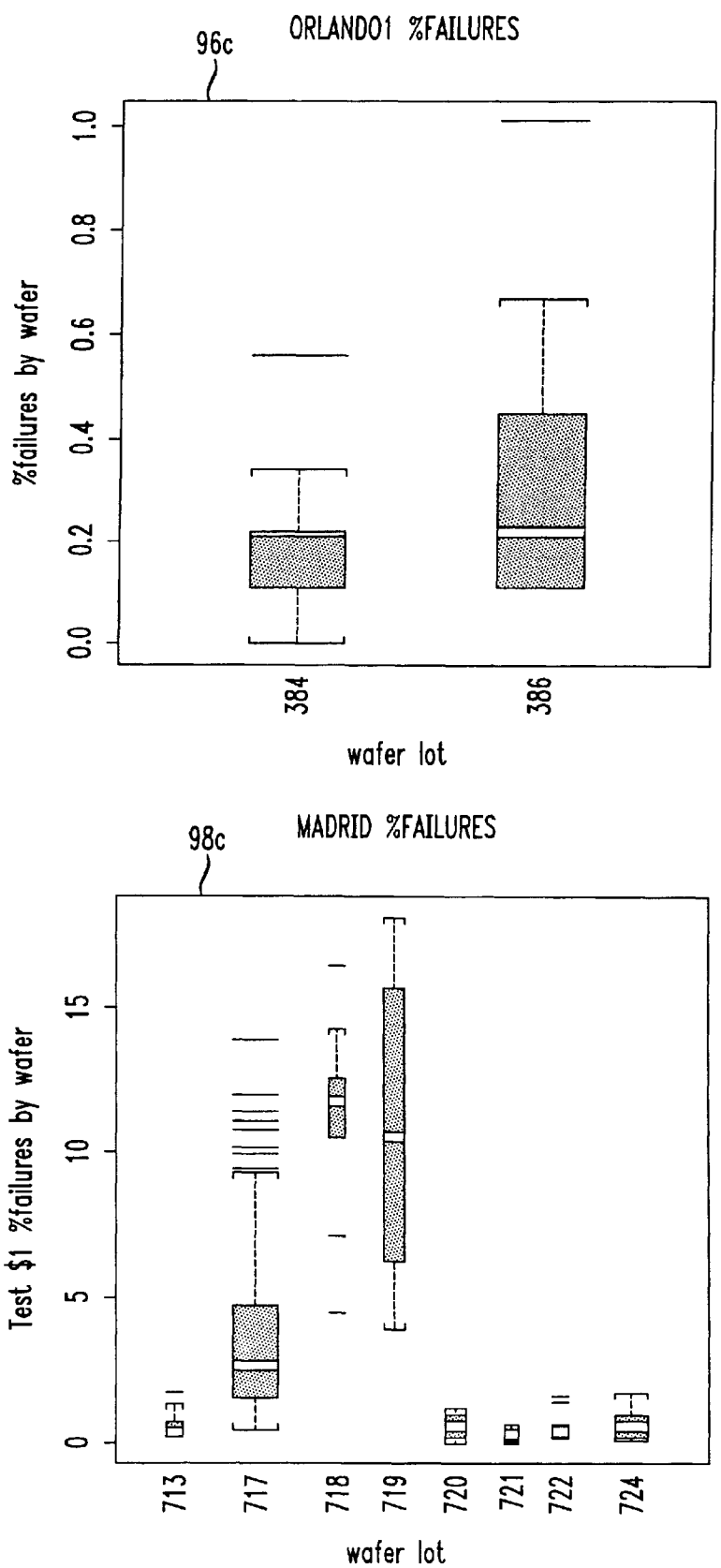
Figure 10:
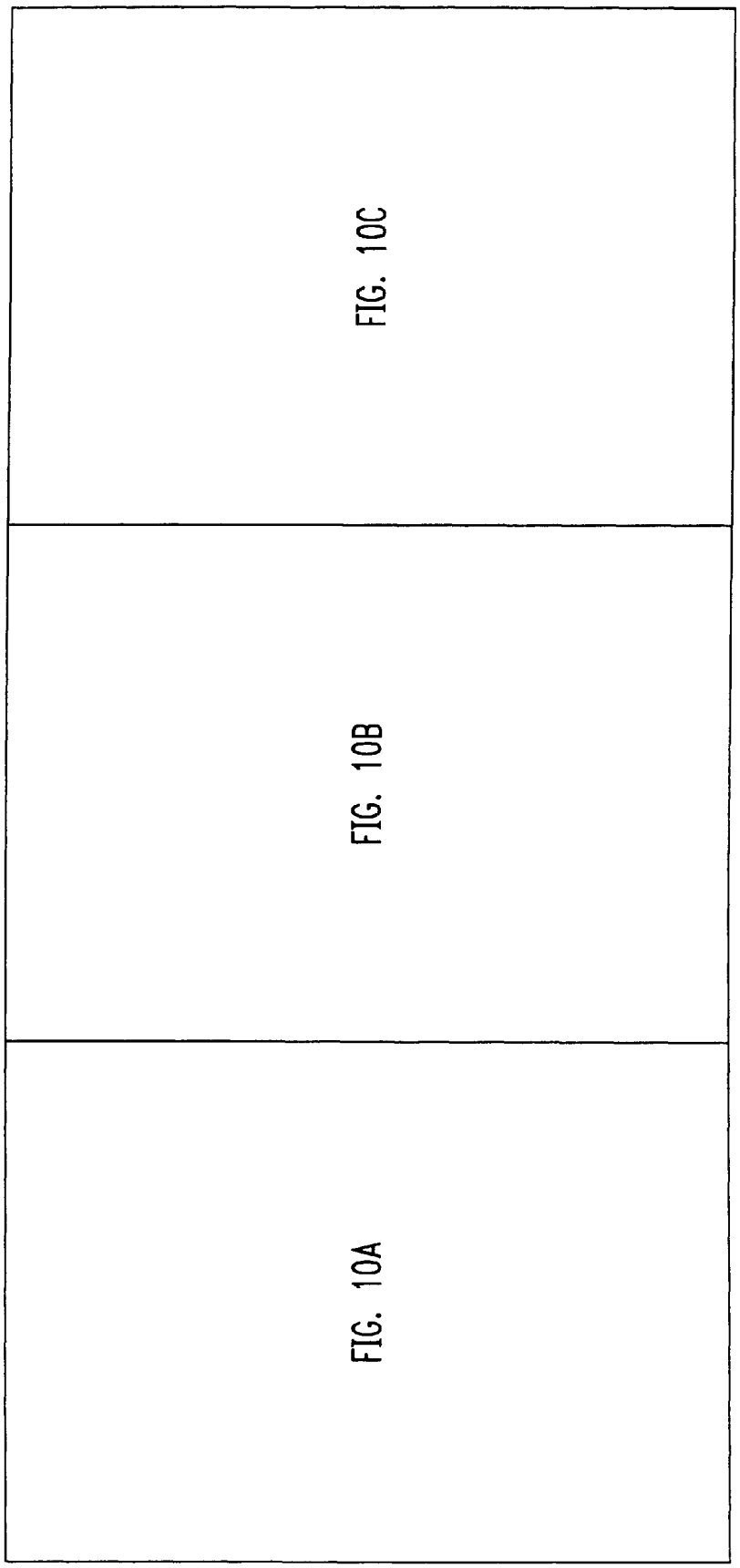
Figure 10A:
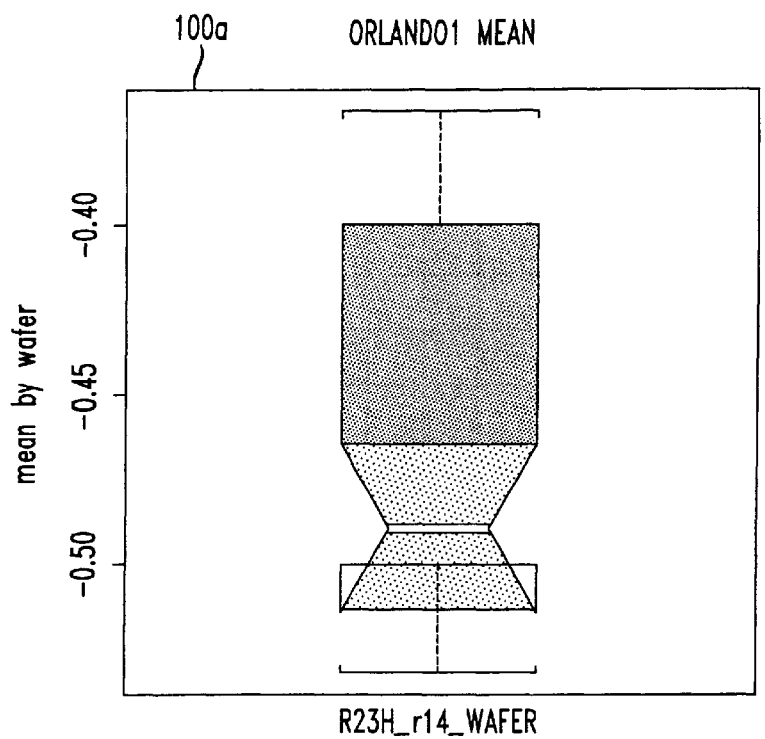
Figure 10A:
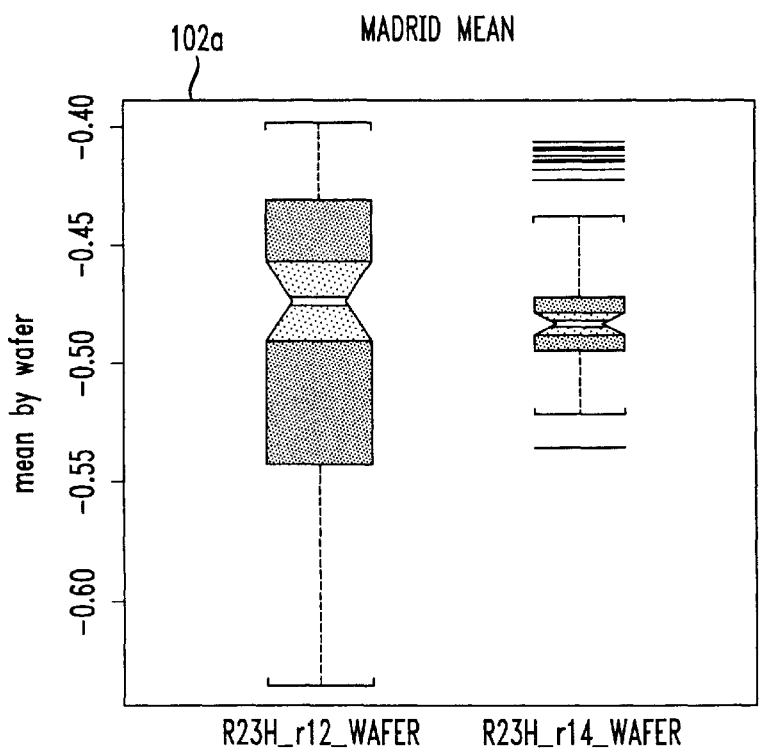
Figure 10B:
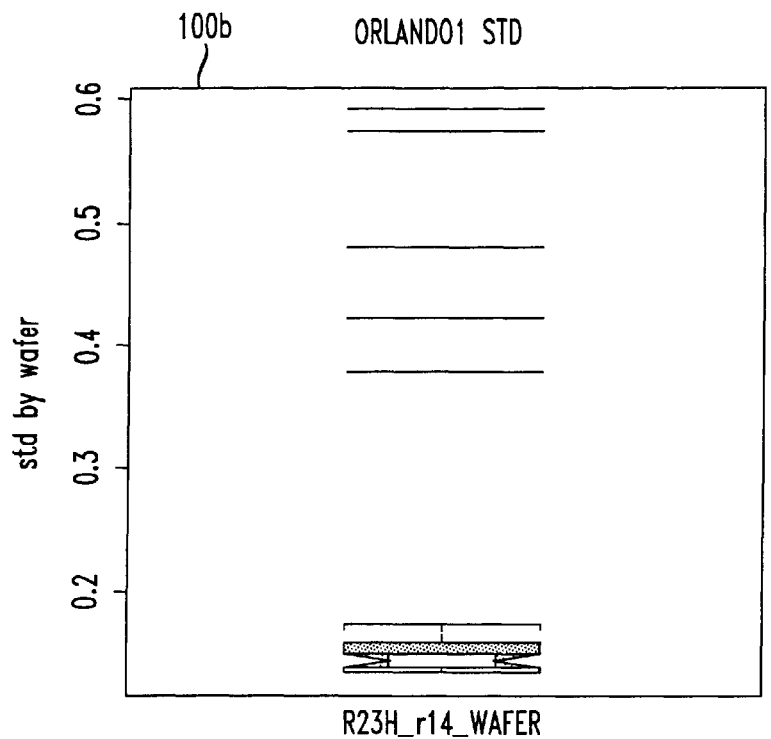
Figure 10B:
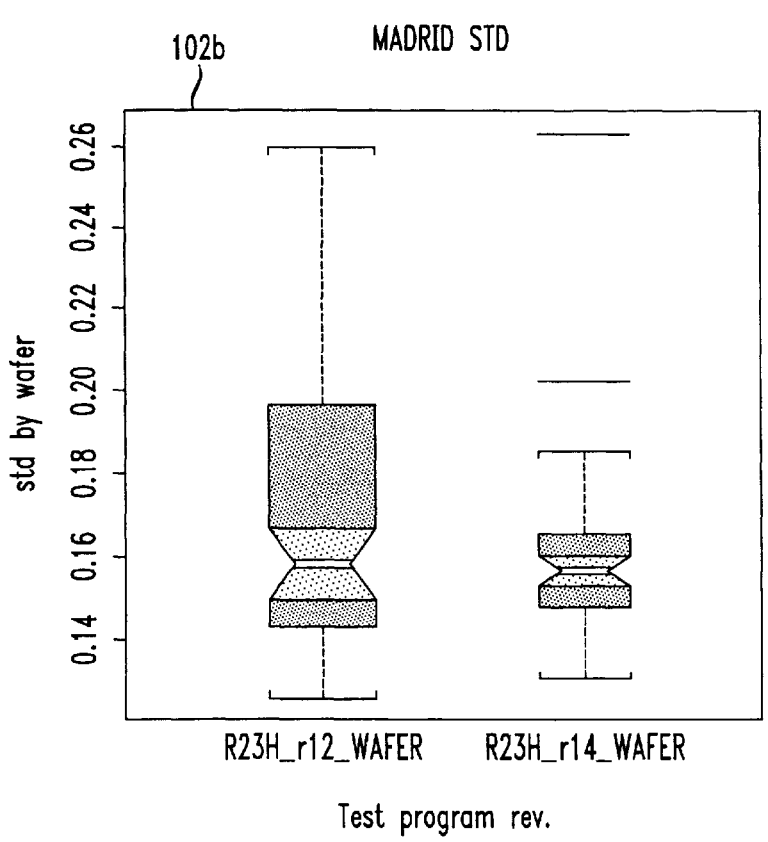
Figure 10C:
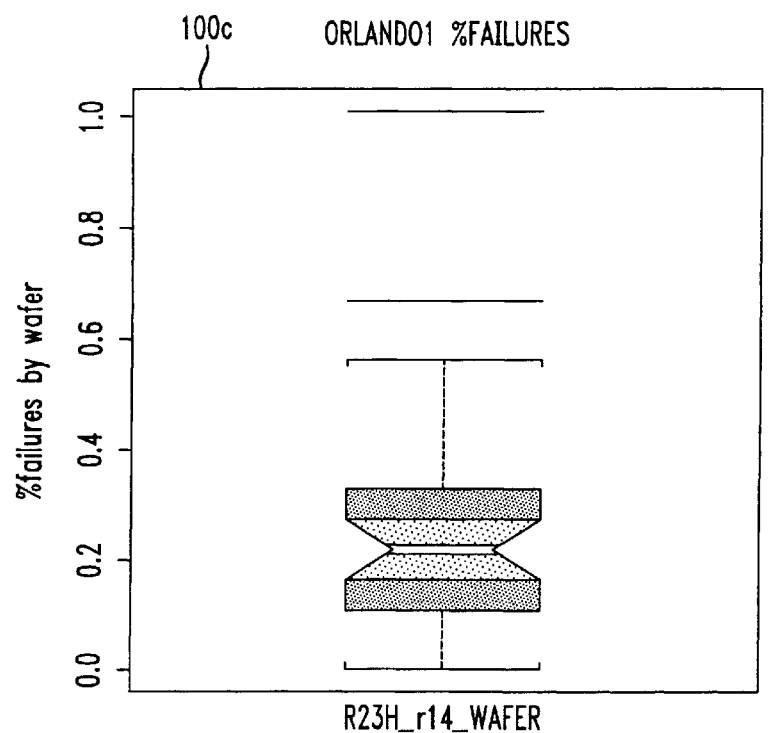
Figure 10C:
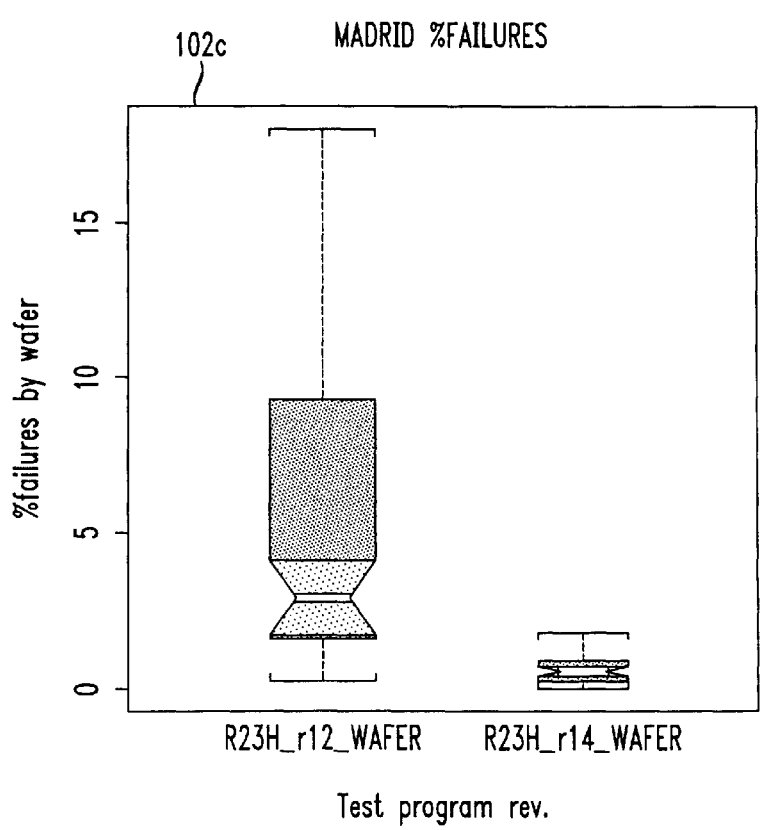

Wafer versus package results are best illustrated by the plots shown in FIGS. 4, 4A, 4B, and 4C. These plots are made available by a postscript file. In case of tests not run at wafer level or package level, no comparison will be possible and the page will be empty. Three plots are generated for a single wafer factory, and six plots are generated for two wafer factories producing the same devices. FIG. 4 provides plots for two different wafer factories: Orlando and Madrid, for example. The plots are by wafer lot, which is the minimum common unit for comparision of the test results.

Plots 50a, 52a in the first column respectively compares the mean values of a particular test for each wafer lot for a wafer factory. For example, each point represents a mean test result for all the same type test performed for a particular wafer lot. This is done so that comparision of the test results can be compared at package level. The standard deviations are shown by plots 50b, 52b in the second column. In addition, the percetage of failures are provided by plots 50c, 52c in the third column. Plots 50a–50c represent data collected at a first processing facility, e.g., Orlando, whereas plots 52a–52c represent data collected at a second processing facility, e.g., Madrid.

Each plot point, e.g., plot point 54, represents one wafer lot. The x-axis are wafer lot results and the y-axis are package level results. To interpret these plots you have to look at column one first, i.e., plots 50a and 52a. If there is a strong correlation between wafer and package results, this will be reflected in the third column. High values in the y-axis (package data) and low values in the x-axis (wafer data) mean more failures at package level.

It is more desirable to have the failures at the wafer level since it is easier to implement corrective action by adjusting the manufacturing process or changing processing limits. For example, with the information provided by plots 50a, 52a in the first column, a limit change can easily be calculated and implemented. FIGS. 4, 4A, 4B, and 4C thus presents a clear example of problems with test limits. In the first plot there is a strong correlation of the results at the first processing factory as indicated by the plot points being gathered along the straight line 56. There is a clear shift between package level (y-axis) and wafer level (x-axis) test data. In plot 50c, however, the devices fail mainly at the package level. These results suggest the need of a readjustment of the test limits so that the bad devices may be screened at wafer level.

A second postscript file can be used to present statistic correlations. This is another opportunity to compare wafer and package results. This page contains 9 plots when there are two different manufacturing facilities. Plots 60a–60c in the first row represents package level data. Plots 62a–62c in the second row and plots 64a–64c in the third row respectively show wafer level data from different manufacturing facilities. As will will described below, the wafer level failures are strongly related to the mean results.

Plots 60a, 62a, and 64a in the first column compares the mean and the standard deviation of each package lot, i.e., each wafer at wafer level. The remaining plots 60b, 62b, 64b and 60c, 62c, 64c in the second and third columns identify the relationship between test results and failures. If failures correlate with test means, the slope of the correlation curve determines if the failures are below or above specification. When failures correlate only with standard deviation values, additional information is needed by looking at other plots and identifying why the standard deviation values vary.

As illustrated by the plots in FIGS. 5, 5A, 5B, and 5C there is a clear example of a test that is failing below specification at wafer level. This is indicated by the negative slopes at the mean vs. failures plots 60b, 62b and 64b. Standard deviation (plots 60c, 62c and 64c) is small and random, meaning that the test is stable and so are the devices. An interesting effect is observed in the central plot 62b. Some points, i.e., wafers with a mean below 28.7 show 0% failures. A deeper investigation determined that in one of the wafer factories the test limits were changed in the period of time covered by the analysis.

Yet another postscript file can be used to present histogram plots of the wafer results, as best illustrated in FIGS. 6, 6A, 6B, and 6C. Histogram plots offer information about distributions of the test results.

This data is very valuable for adjustment of limits and comparison between wafer factories. They also provide an idea of the uniformity of the test and product. Plots 70a–70c and 72a–72c provide the wafer results of a particular device that is manufactured in two different locations. The shapes of the histograms indicate the results are fairly uniform. Plots 70a, 72a represent mean distributions, whereas plots 70b, 72b represent standard deviation distributions. Percentage failures are provided in plots 70c, 72c.

Both mean and standard distributions are very similar to a gaussian shape. The results are also different between the two factories. Plot 70*a* for the first factory has mean values in the range of about 88–92, whereas plot 72*a* for the second factory has mean ranges between about 91 and 96. A similar pattern exists for the standard deviation plots 70*b* and 72*b*. The results are wider for the second manufacturing factory.

These differences have an important impact on yield, as shown in plots 70*c* and 72*c* of the third column. The important information obtained from the histograms include the following. For this particular test, the second factory product is more unstable as indicated by the wider standard deviation. Failures are above specification. Only the second factory, where the means are higher, show failures. Next step will be to find which process is causing this difference between the factories. A slight relaxation of the test upper limit would help in the short term.

Another postscript file represents evolution in time of the wafer results, as shown by the plots 80*a*–80*c* and 82*a*–82*c* of FIGS. 7, 7A, 7B, 7C, 7D, 7E, and 7F. The time evolution of a test offers a lot of information. Although most of the times the same information can be obtained from other plots, this format helps to clarify the conclusions. Interpretation of the plots will now be discussed.

Uniform variations of the mean or standard deviation values in time indicate that a process is shifting. Correlation analysis of the test with electrical test data (E-test) is the next step for the identification of the process. Abrupt jumps are related to a new test program revision or a change in one process. Again, further anlysis includes correlation studies of the test results with E-test data.

Wide distributions in a single day are related to equipment differences in a particular process. For any other process, a common resources tool will need to be run. The results by wafer lot plots discussed below will help on the identification of lots with anomalous behavior. FIGS. 7, 7A, 7B, 7C, 7D, 7E, and 7F thus presents an example where results from a particular wafer factory move with time, such as the process shift identified in plot 82*a*.

Another postscript file represents package results by tester, as shown by the plots 90*a*–90*c*, 92*a*–92*c* and 94*a*–94*c* of FIGS. 8, 8A, 8B, and 8C. When the mean values vary for different testers, this indicates that each tester is contributing with a constant component to the test results. Higher standard deviation values on a tester are identified with noise. Any of these problems is susceptible of impacting yield. The problematic testers are easily identified in FIGS. 8, 8A, 8B, and 8C. The differences can be mainly detected in the plot of the mean values, i.e., plots 90*a*–94*a*. Testers impacting yield are easily identified at the third column of plots, i.e., plots 90*c*–94*c*.

Yet another postscript file represents wafer results by wafer lot, as shown by the plots 96*a*–96*c* and 98*a*–98*c* of FIGS. 9, 9A, 9B, and 9C. It is always interesting to look at the results for each wafer lot. The detection of lots with abnormal results opens the way to further investigations, such as common resources or the analysis of in-line experiments. In addition, long boxes (wide distributions within the lot) indicate problems that can be studied in more detail with other tools, e.g., wafer maps, test results by device . . . FIGS. 9, 9A, 9B, and 9C presents an example of a new code, as indicated by the few wafer lots and the two clearly different populations at the second factory. With the help of the rest of the plots in the file it will be easy to determine if the problem is process, tester or test program related.

Another postscript file represents wafer results by test program revision, as shown by the plots 100*a*–100*c* and 102*a*–102*c* of FIGS. 10, 10A, 10B, and 10C. Each box, e.g., 104, in the plots represents a different test program revision. Most of the time there will be only one per plot, meaning the test program was not changed in the last month. In case of more than one test program revision any difference will be very visible. An important factor to take in account is the width of the boxes. Wider boxes mean more devices are tested. So for a very tiny box, care must be taken when interpretating the plot.

In a periodic basis (e.g., once a week) the most yield impacting tests for each wafer and package lot are identified. In particular, the test data are combined for each formed device and presented for viewing by engineers. With this data, the engineers know exactly what to focus their efforts on. They just have to read the reports and work from there. An example of a prioritized list of impacting tests, at wafer level, for example, was provided by FIG. 3.

Test limits can impact yield in two cases. One, if the test results are "at the edge" of the specification, and second, when the wafer level and package level limits are not balanced. Detection of these problems is not a straightforward task. It implies gathering information from different sources, mixing the information, and sometimes guessing.

The first step to find out if a particular machine produces a yield impact is to identify a group of wafers or lots with different yield than the regular production. The web page (FIG. 3) provides access to information that makes the detection of "special" groups easy and fast. Once the special product is identified, any "common resources" tool can be used to find the resource that is causing the problem.

Sometimes a test is slightly but consistently failing in all lots. Limits cannot be relaxed without customer approval, and the only option is to implement a design modification that puts the product into spec. In case this happens, the plots presented via the initial web page provide a clear picture of the situation, what makes the analysis much easier.

The method according to the present invention offers wafer level versus package level comparisons as well as histograms for each "yield impacting" test. This information is key to identify when a limits readjustment is needed as well as to define appropriate values. After corrective action has been implemented, the method is finished at Block 30.

Another aspect of the invention relates to an apparatus 120 (FIG. 11) implementing the method according to the present invention. The apparatus 120 includes a first tester 122 for performing a plurality of tests on a plurality of wafers 130 each comprising a plurality of dies 132*a*–132*n* to determine good dies and failed dies. The apparatus 120 also includes a second tester 124 for performing the plurality of tests on the good dies 132*a* after packaging to determine good packaged dies and failed packaged dies. A processor 126 is connected to the first tester 122 and to the second tester 124 for determining which tests indicate both failed dies and failed packaged dies so that corrective action may be taken.

Each die comprises analog circuits. The first and second testers 122, 124 each perform the plurality of tests by applying analog input signals to each die, and measuring analog output signals therefrom. The processor 126 prioritizes the plurality of tests performed on the dies based upon the failed dies, and prioritizes the plurality of tests performed on the packaged good dies based upon the failed packaged dies.

A memory 128 is connected to the processor 126. The memory 128 stores a database based upon the prioritized tests performed on the dies and based upon the prioritized tests performed on the good dies after packaging. The database is accessible via the Internet 136 so that other facilities processing the same type devices can review and compare the information to their own data.

The processor 126 calculates statistical data based upon the plurality of tests performed on the dies, and calculates statistical data based upon the plurality of tests performed on the good dies after packaging. The apparatus 120 further includes a display 138 connected to the processor 126 for graphically displaying the statistical data for the tests.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for processing semiconductor wafers comprising:

forming a plurality of wafers each comprising a plurality of dies;

performing a plurality of tests on the plurality of dies to determine good dies and failed dies;

packaging the good dies;

performing the plurality of tests on the good dies after packaging to determine good packaged dies and failed packaged dies;

determining which tests indicate both failed dies and failed packaged dies; and implementing corrective action based upon the tests which indicate both failed dies and failed packaged dies.

2. A method according to claim 1 wherein each die comprises analog circuits.

3. A method according to claim 2 wherein each performing of the plurality of tests comprises applying analog input signals to each die, and measuring analog output signals therefrom.

4. A method according to claim 1 further comprising:

prioritizing the plurality of tests performed on the dies based upon the failed dies; and prioritizing the plurality of tests performed on the packaged good dies based upon the failed packaged dies.

5. A method according to claim 4 further comprising defining a database based upon the prioritized tests performed on the dies and based upon the prioritized tests performed on the good dies after packaging.

6. A method according to claim 5 wherein the database is accessed via the Internet.

7. A method according to claim 5 wherein the database comprises data collected at different manufacturing facilities.

8. A method according to claim 1 further comprising:

calculating statistical data based upon the plurality of tests performed on the dies; and calculating statistical data based upon the plurality of tests performed on the good dies after packaging.

9. A method according to claim 8 further comprising graphically displaying the statistical data for the tests.

10. A method according to claim 8 wherein the statistical data comprises mean and standard deviations for the tests.

11. A method according to claim 1 wherein packaging the good dies comprises encapsulating each die with a plastic material.

12. A method according to claim 1 wherein implementing corrective comprises adjusting a semiconductor process.

13. A method for processing semiconductor wafers comprising:

forming a plurality of wafers each comprising a plurality of dies, each die comprising analog circuits;

performing a plurality of tests on the plurality of dies to determine good dies and failed dies;

prioritizing the plurality of tests performed on the dies based upon the failed dies;

packaging the good dies;

performing the plurality of tests on the good dies after packaging to determine good packaged dies and failed packaged dies;

prioritizing the plurality of tests performed on the packaged good dies based upon the failed packaged dies;

determining which tests indicate both failed dies and failed packaged dies based upon the prioritized tests; and implementing corrective action based upon the tests which indicate both failed dies and failed packaged dies.

14. A method according to claim 13 wherein each performing of the plurality of tests comprises applying analog input signals to each die, and measuring analog output signals therefrom.

15. A method according to claim 13 further comprising defining a database based upon the prioritized tests performed on the dies and based upon the prioritized tests performed on the good dies after packaging.

16. A method according to claim 15 wherein the database is accessed via the Internet.

17. A method according to claim 15 wherein the database comprises data collected at different manufacturing facilities.

18. A method according to claim 13 further comprising:

calculating statistical data based upon the plurality of tests performed on the dies; and calculating statistical data based upon the plurality of tests performed on the good dies after packaging.

19. A method according to claim 18 further comprising graphically displaying the statistical data for the tests.

20. A method according to claim 18 wherein the statistical data comprises mean and standard deviations for the tests.

21. A method according to claim 13 wherein packaging the good dies comprises encapsulating each die with a plastic material.

22. A method according to claim 13 wherein implementing corrective comprises adjusting a semiconductor process.

* * * * *